United States Patent [19]

Jones et al.

[11] Patent Number: 5,140,611
[45] Date of Patent: Aug. 18, 1992

[54] PULSE WIDTH MODULATED SELF-CLOCKING AND SELF-SYNCHRONIZING DATA TRANSMISSION AND METHOD FOR A TELEPHONIC COMMUNICATION NETWORK SWITCHING SYSTEM

[75] Inventors: Barry W. Jones, Hoffman Ests.; Steven T. DeLong, Elgin, both of Ill.

[73] Assignee: Rockwell International Corporation, El Segundo, Calif.

[21] Appl. No.: 416,077

[22] Filed: Sep. 29, 1989

[51] Int. Cl.⁵ .......................... H03K 7/08; H03K 9/08
[52] U.S. Cl. .......................................... 375/7; 375/22; 370/9; 332/109; 340/870.24
[58] Field of Search ............... 370/8, 9, 110.1, 77; 375/7, 22; 332/109; 340/870.24, 825.63

[56] References Cited

U.S. PATENT DOCUMENTS

| | | | |
|---|---|---|---|
| 2,429,613 | 10/1947 | Deloraine et al. | 370/10 |
| 2,454,792 | 11/1948 | Grieg | 370/10 |
| 2,495,739 | 1/1950 | Labin et al. | 370/10 |
| 2,541,076 | 2/1951 | Labin et al. | 370/9 |
| 4,129,751 | 12/1978 | Alles | 370/9 |
| 4,175,214 | 11/1979 | Wedmore | 370/9 |
| 4,207,524 | 6/1980 | Purchase | 375/22 |
| 4,327,441 | 4/1982 | Bradshaw | 375/113 |
| 4,497,068 | 1/1985 | Fischer | 375/22 |
| 4,651,114 | 3/1987 | Steinmayer et al. | 332/109 |
| 4,885,738 | 12/1989 | Bowers et al. | 370/110.1 |

Primary Examiner—Benedict V. Safourek
Assistant Examiner—Young Tse
Attorney, Agent, or Firm—C. B. Patti; V. L. Sewell; H. F. Hamann

[57] ABSTRACT

Transmissions of synchronous digital data from a master control unit (50A) to a slave, network termination unit (50B) are via a pulse width modulated data stream including pulse width modulated binary code pulses (20, 22) with a pulse width modulated synchronization pulse (24) all of which have a preselected leading edge transition (28) at the same point in each cycle of a master clock signal. A clock signal is derived at the network termination unit (50B) from the received pulse width modulated binary data stream for decoding and for nonself-clocking, synchronous transmissions from the slave, network termination unit (50B) to the master, control unit (50A). The phase synchronization pulse (24) is employed to maintain phase sychronization between the transmission to and from the control unit (50A).

46 Claims, 31 Drawing Sheets

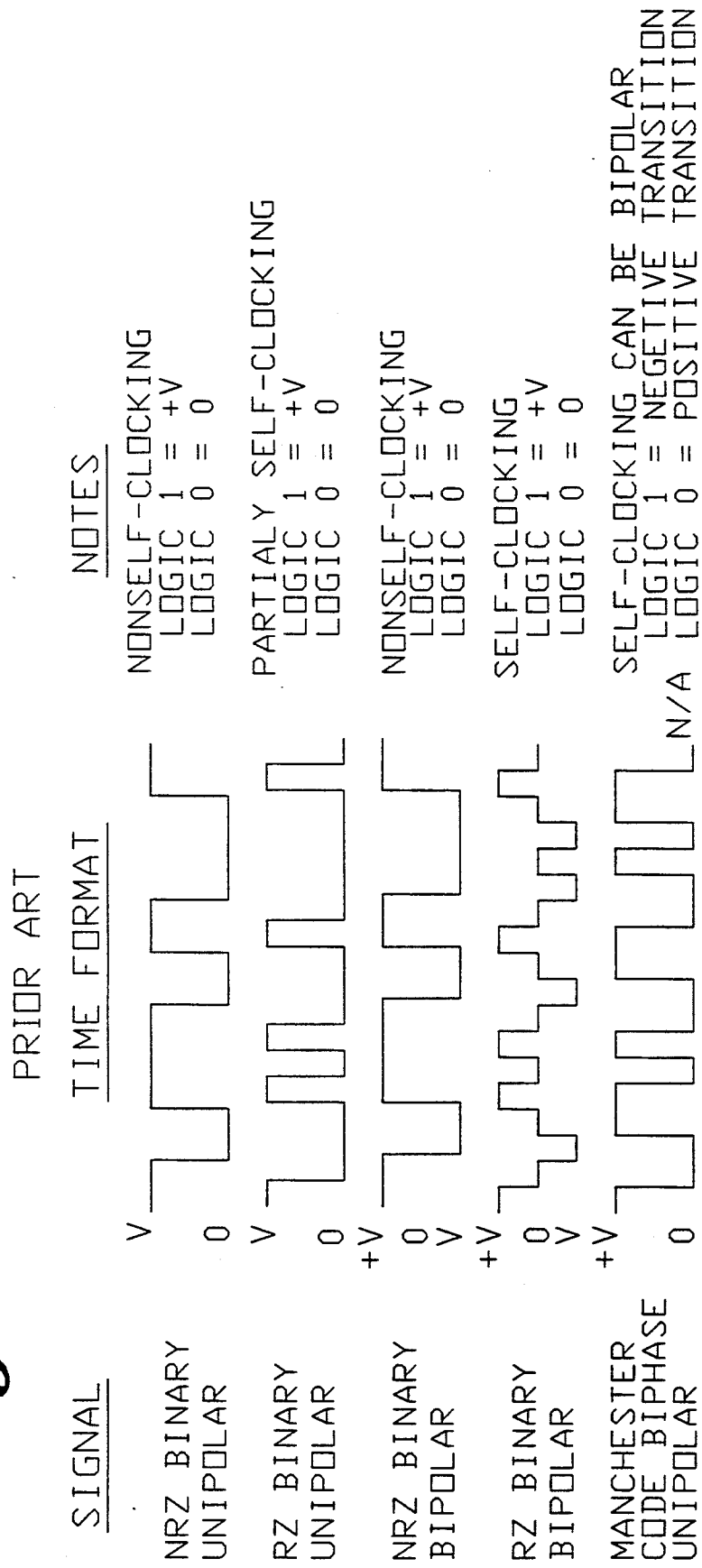

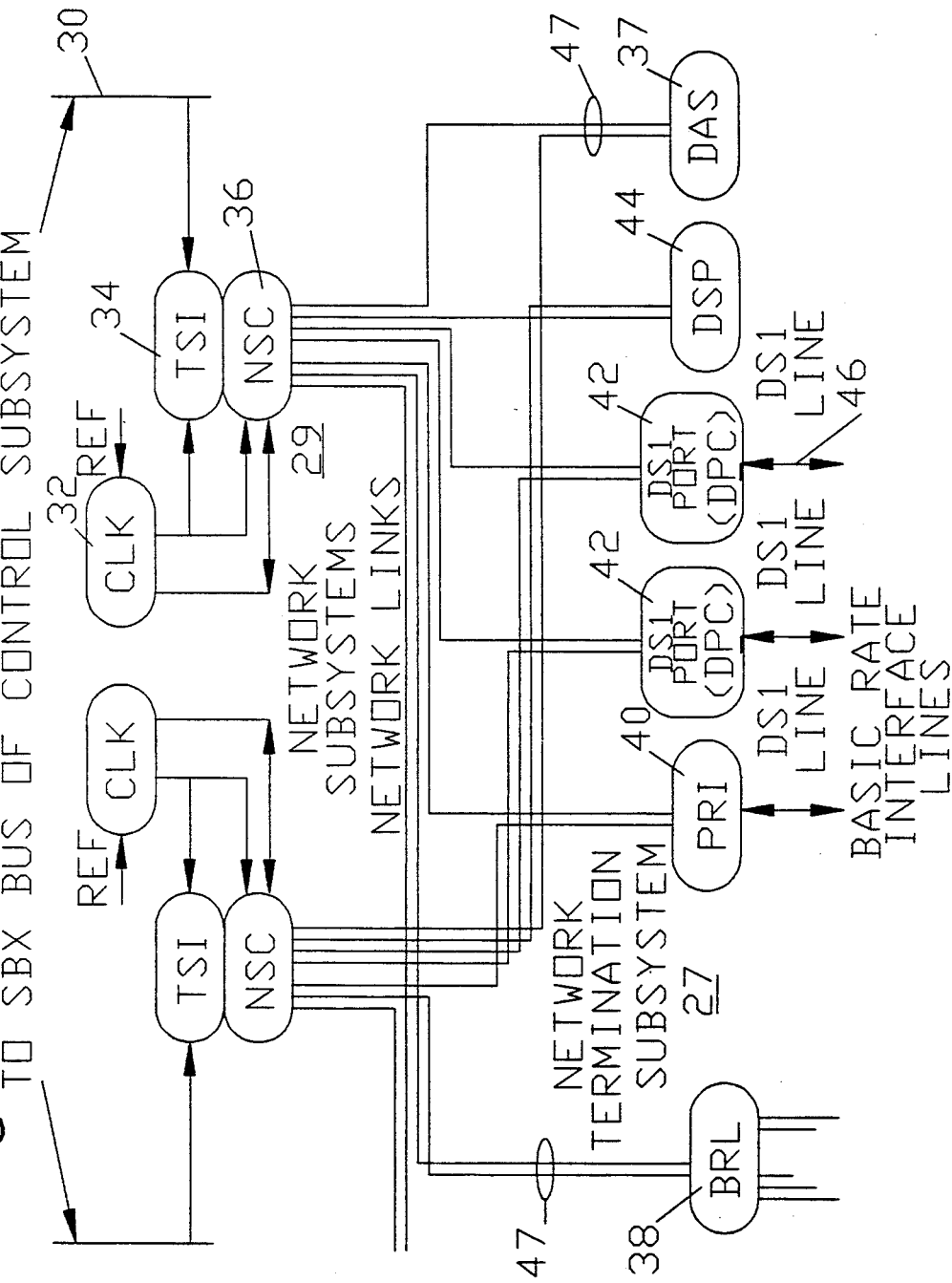

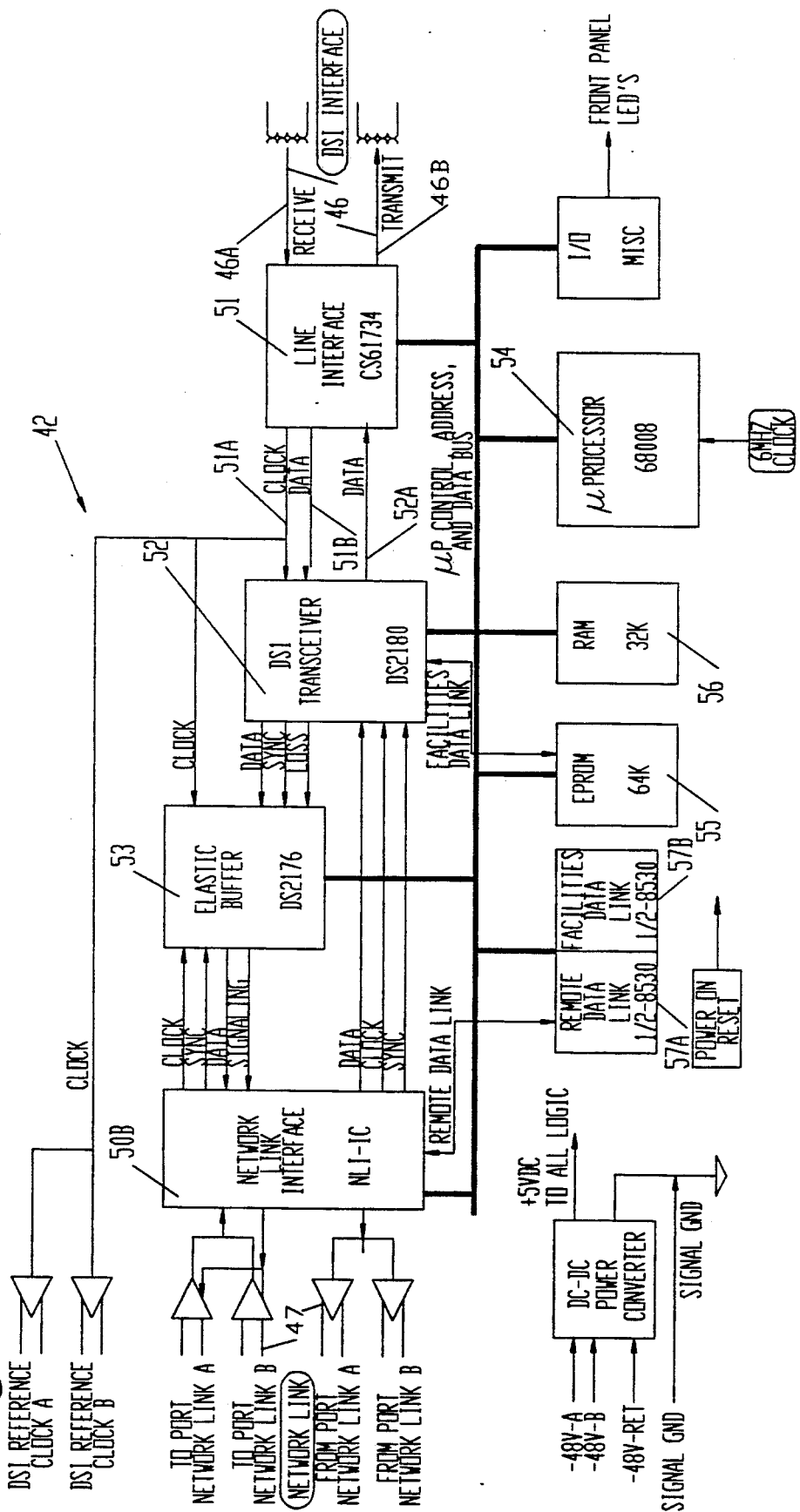

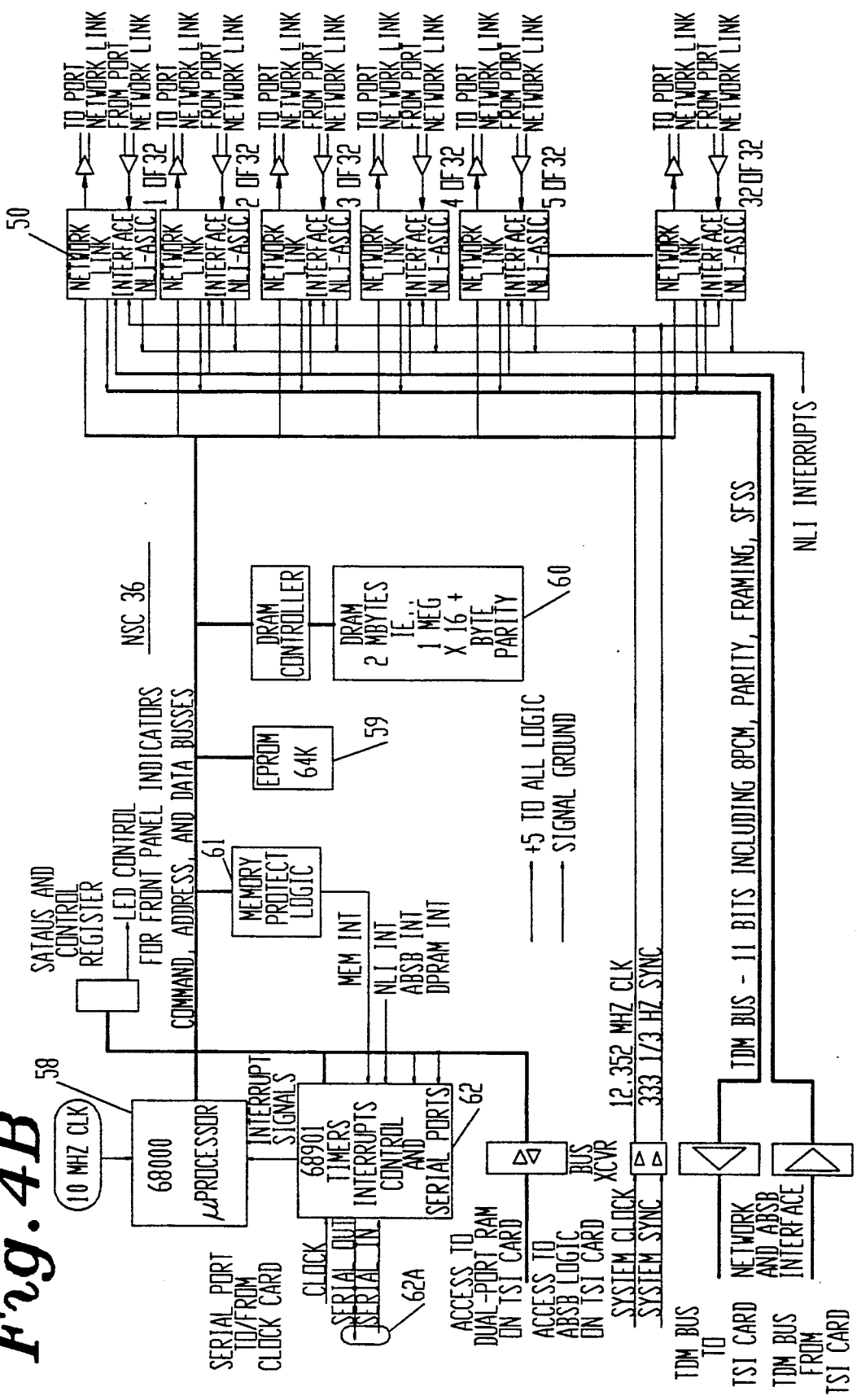

Fig. 6C

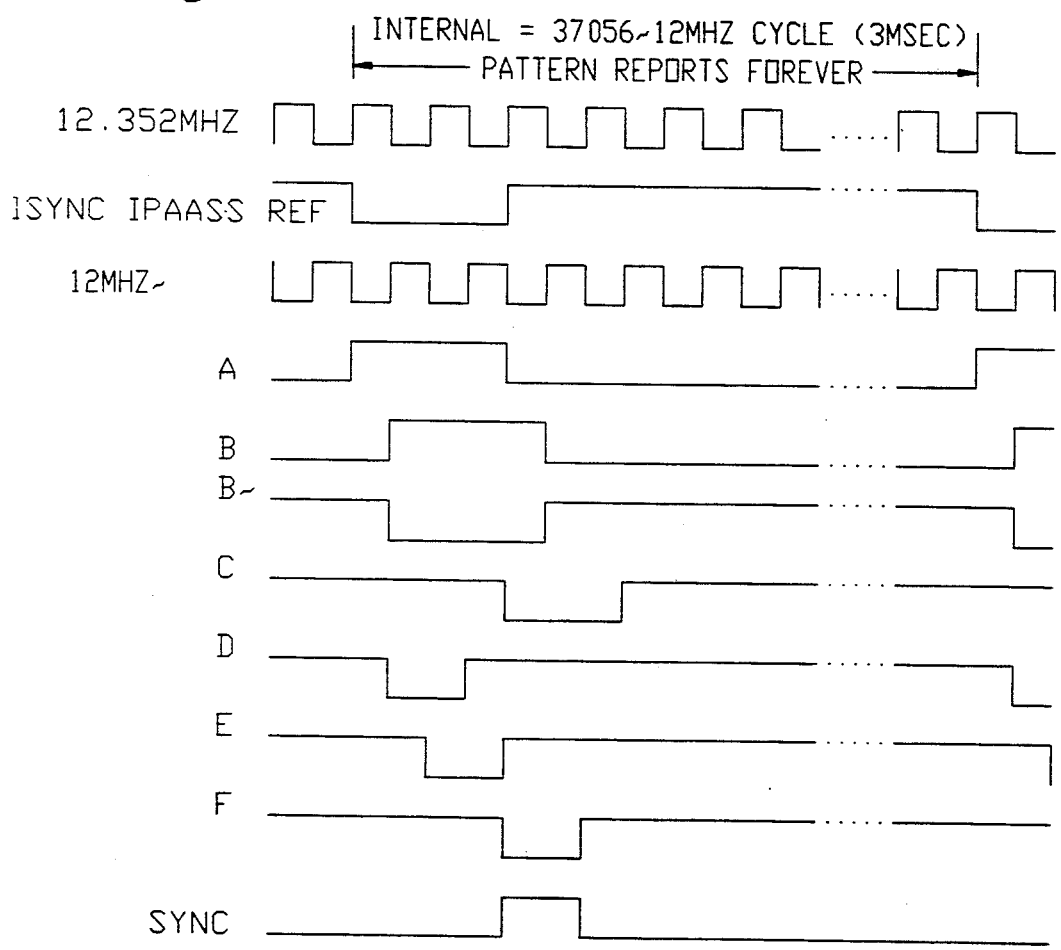

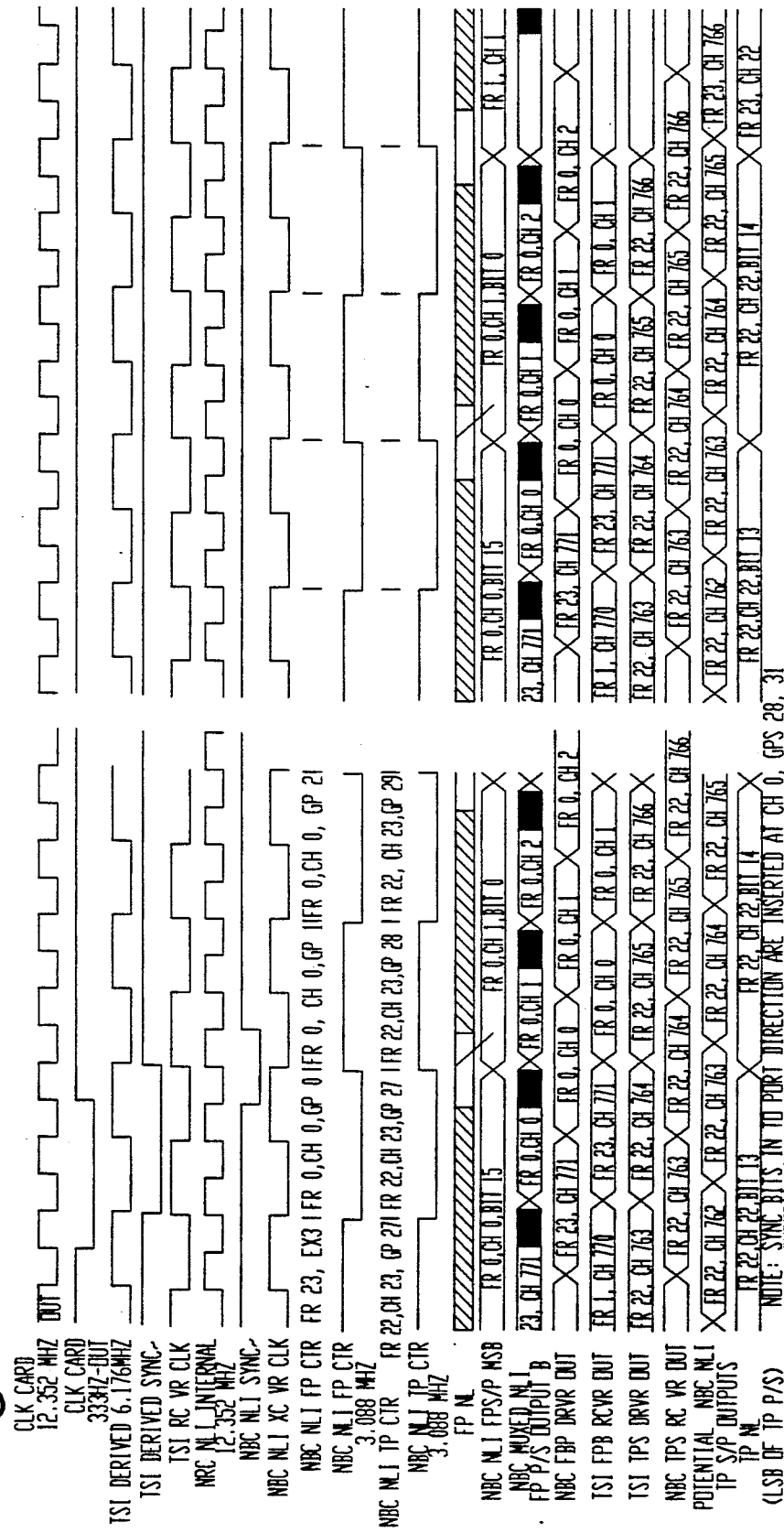

Fig. 10

| MODE NAME | MODE PIN A | MODE PIN B | FEATURES PROVIDED | USED BY | MASTER/SLAVE PIN |
|---|---|---|---|---|---|
| 0 | L | L | 11 BIT PARALLEL DATA INBOUND INC 8 PCM, 3 SYSTEM BITS 11 BIT PARALLEL DATA OUTBOUND INC 8 PCM, 3 SYSTEM BITS | NSC | H |
| 1 | L | H | WITH, OPTIONALLY SERIAL DATA INBOUND SERIAL DATA OUTBOUND WITH, OPTIONALLY 4 BIT PARALLEL SIGNALING DATA OUTBOUND | DPC,PRI,BRL | L |
| 2 | H | L | 8 BIT PARALLEL DATA INBOUND 8 BIT PARALLEL DATA OUTBOUND | DAS | L |
| 3 | H | H | SERIAL DATA INBOUND SERIAL DATA OUTBOUND | DSP | L |

Fig. 14

| CONTROL MS REGISTER (A5-A1 = 00000) | | | | | | | |
|---|---|---|---|---|---|---|---|
| D7 | D6 | D5 | D4 | D3 | D2 | D1 | D0 |
| GRL MI | GMC OSI | GRL OSI | GTF PEI | GRF PEI | GRM CEI | GOD PEI | GRL PEI |

D7 GENERATE RECEIVE LINK MESSAGE INTERRUPTS
D6 GENERATE MASTER CLOCK OUT-OF-SYNC INTERRUPTS
D5 GENERATE RECEIVE LINK OUT-OF-SYNC INTERRUPTS
D4 GENERATE TRANSMIT FIFO PARITY ERROR INTERRUPTS
D3 GENERATE RECEIVE FIFO PARITY ERROR INTERRUPTS
D2 GENERATE RECEIVE MESSAGE CHECKSUM ERROR INTERRUPTS
D1 GENERATE OUTPUT DATA PARITY ERROR INTERRUPTS
D0 GENERATE RECEIVE LINK PARITY ERROR INTERRUPTS

Fig. 15

| CONTROL SS REGISTER (A5-A1 = 00001) | | | | | | | |
|---|---|---|---|---|---|---|---|
| D7 | D6 | D5 | D4 | D3 | D2 | D1 | D0 |
| MRL MI | MMC OSI | MRL OSI | MTF PEI | MRF PEI | MRM CEI | MOD PEI | MRL PEI |

D7 MASK RECEIVE LINK MESSAGE INTERRUPTS
D6 MASK MASTER CLOCK OUT-OF-SYNC INTERRUPTS
D5 MASK RECEIVE LINK OUT-OF-SYNC INTERRUPTS
D4 MASK TRANSMIT FIFO PARITY ERROR INTERRUPTS
D3 MASK RECEIVE FIFO PARITY ERROR INTERRUPTS
D2 MASK RECEIVE MESSAGE CHECKSUM ERROR INTERRUPTS
D1 MASK OUTBOUND DATA PARITY ERROR INTERRUPTS
D0 MASK RECEIVE LINK PARITY ERROR INTERRUPTS

Fig. 16

| CONTROL TS REGISTER (A5-A1 = 00010) | | | | | | | |
|---|---|---|---|---|---|---|---|
| D7 | D6 | D5 | D4 | D3 | D2 | D1 | D0 |
| IDE | SUR FM | SLRL | GEP ID | UN USED | 566 4E | TPC ME | TSI GE |

D7 INBOUND DATA ENABLE (0 = TRI-STATE; CLEARED ON OUT-OF-SYNC)
D6 SUPERFRAME TYPE (1 = 24 FRAMES, 0 = 12 FRAMES)
D5 SELECT LOCAL RECEIVE LINK (0 = A LINK; 1 = B LINK)
D4 GENERATE EVEN PARITY ON INBOUND DATA/ CHECK EVEN PARITY ON OUTBOUND DATA (0 = ODD PARITY)
D3 NOT USED
D2 56/64KBPS DATALINK ENABLE
D1 TEST PCM INSERTION ENABLE
D0 TEST SIGNALING INSERTION ENABLE

Fig. 17

| | | | | | | | |
|---|---|---|---|---|---|---|---|
| CONTROL LS REGISTER (A5-A1 = 00011) ||||||||
| D7 | D6 | D5 | D4 | D3 | D2 | D1 | D0 |
| RFL | TFRC | UN USED | 56/ 64S | SEND | RC | NMIC | FES LR |

D7 RECEIVE FIFO LOCK (1 = WRITES TO FIFO INHIBITED)
D6 TRANSMIT FIFO RESET CONTROL (1 = HOLD IN RESET
D5 NOT USED
D4 56/64KBPS DATALINK SELECT (0 - 56 KBPS;
   1 = 64 KBPS)
D3 SEND MESSAGE (ON 0->1; CLEARED WHEN
   MESSAGE TRANSMITTED)
D2 FAR-END RESET CONTROL (1 = ISSUE NMI)
D1 FAR-END NMI CONTROL (1 = ISSUE NMI)
D0 FAR-END SWITCH LINK REQUEST (1 = ISSUE
   SWITCH REQUEST)

Fig. 18

| | | | | | | | |
|---|---|---|---|---|---|---|---|
| INTERRUPT STATUS REGISTER (A5-A1 = 00100, RO) ||||||||
| D7 | D6 | D5 | D4 | D3 | D2 | D1 | D0 |
| RFF | MCO SE | RLO SE | TFPE | RFPE | RMCE | ODPE | RLPE |

D7 RECEIVE FIFO FULL
D6 MASTER CLOCK OUT-OF-SYNC
D5 RECEIVE LINK OUT-OF-SYNC ERROR
D4 TRANSMIT FIFO PARITY ERROR
D3 RECEIVE FIFO PARITY ERROR
D2 RECEIVE MESSAGE CHECKSUM ERROR
D1 OUTBOUND DATA PARITY ERROR
D0 RECEIVE LINK PARITY ERROR

Fig. 19

| | | | | | | | |
|---|---|---|---|---|---|---|---|
| POSITION REGISTER (A5-A1 = 00101) ||||||||
| D7 | D6 | D5 | D4 | D3 | D2 | D1 | D0 |
| UN- USED | UN- USED | UN- USED | P4 | P3 | P2 | P1 | P0 |

D5-D7  NOT USED
D4     POSITION BIT 4
D3     POSITION BIT 3
D2     POSITION BIT 2
D1     POSITION BIT 1
D0     POSITION BIT 0

Fig. 20

TRANSMIT LINK MS COUNTER LOAD REGISTER (A5-A1 =00110)

| D7 | D6 | D5 | D4 | D3 | D2 | D1 | D0 |
|---|---|---|---|---|---|---|---|
| TLU CL4 | TLU CL3 | TLU CL2 | TLU CL1 | TLU CL0 | TLLC L10 | TLLC L9 | TLLC L8 |

D7 TRANSMIT LINK UPPER COUNTER LOAD BIT 4
D6 TRANSMIT LINK UPPER COUNTER LOAD BIT 3
D5 TRANSMIT LINK UPPER COUNTER LOAD BIT 2
D4 TRANSMIT LINK UPPER COUNTER LOAD BIT 1
D3 TRANSMIT LINK UPPER COUNTER LOAD BIT 0
D2 TRANSMIT LINK LOWER COUNTER LOAD BIT 10
D1 TRANSMIT LINK LOWER COUNTER LOAD BIT 9
D0 TRANSMIT LINK LOWER COUNTER LOAD BIT 8

Fig. 21

TRANSMIT LINK LS COUNTER LOAD REGISTER (A5-A1 = 00100)

| D7 | D6 | D5 | D4 | D3 | D2 | D1 | D0 |
|---|---|---|---|---|---|---|---|
| TLLC L7 | TLLC L6 | TLLC L5 | TLLC L4 | TLLC L3 | TLLC L2 | TLLC L1 | TLLC L0 |

D7 TRANSMIT LINK LOWER COUNTER LOAD BIT 7
D6 TRANSMIT LINK LOWER COUNTER LOAD BIT 6
D5 TRANSMIT LINK LOWER COUNTER LOAD BIT 5
D4 TRANSMIT LINK LOWER COUNTER LOAD BIT 4
D3 TRANSMIT LINK LOWER COUNTER LOAD BIT 3
D2 TRANSMIT LINK LOWER COUNTER LOAD BIT 2
D1 TRANSMIT LINK LOWER COUNTER LOAD BIT 1
D0 TRANSMIT LINK LOWER COUNTER LOAD BIT 0

Fig. 22

RECEIVE LINK MS COUNTER LOAD REGISTER (A5-A1 = 01000)

| D7 | D6 | D5 | D4 | D3 | D2 | D1 | D0 |
|---|---|---|---|---|---|---|---|
| RLU CL4 | RLU CL3 | RLU CL2 | RLU CL1 | RLU CL0 | RLLC L10 | RLLC L9 | RLLC L8 |

D7 RECEIVE LINK UPPER COUNTER LOAD BIT 4
D6 RECEIVE LINK UPPER COUNTER LOAD BIT 3
D5 RECEIVE LINK UPPER COUNTER LOAD BIT 2
D4 RECEIVE LINK UPPER COUNTER LOAD BIT 1
D3 RECEIVE LINK UPPER COUNTER LOAD BIT 0
D2 RECEIVE LINK UPPER COUNTER LOAD BIT 10
D1 RECEIVE LINK UPPER COUNTER LOAD BIT 9
D0 RECEIVE LINK UPPER COUNTER LOAD BIT 8

Fig.23

| RECEIVE LINK COUNTER LOAD REGISTER (A5-A1 = 01001) ||||||||
|---|---|---|---|---|---|---|---|
| D7 | D6 | D5 | D4 | D3 | D2 | D1 | D0 |
| RLL CL7 | RLL CL6 | RLL CL5 | RLL CL4 | RLL CL3 | RLL CL2 | RLL CL1 | RLL CL0 |

D7 RECEIVE LINK LOWER COUNTER LOAD BIT 7
D6 RECEIVE LINK LOWER COUNTER LOAD BIT 6
D5 RECEIVE LINK LOWER COUNTER LOAD BIT 5
D4 RECEIVE LINK LOWER COUNTER LOAD BIT 4
D3 RECEIVE LINK LOWER COUNTER LOAD BIT 3
D2 RECEIVE LINK LOWER COUNTER LOAD BIT 2
D1 RECEIVE LINK LOWER COUNTER LOAD BIT 1
D0 RECEIVE LINK LOWER COUNTER LOAD BIT 0

Fig.24

| EXTRACTION ADDRESS REGISTER (A5-A1 = 10101) ||||||||
|---|---|---|---|---|---|---|---|
| D7 | D6 | D5 | D4 | D3 | D2 | D1 | D0 |
| UN-USED | UN-USED | UN-USED | EA4 | EA3 | EA2 | EA1 | EA1 |

D5-D7 NOT USED
D4      EXTRACTION CHANNEL BIT 4
D3      EXTRACTION CHANNEL BIT 3
D2      EXTRACTION CHANNEL BIT 2
D1      EXTRACTION CHANNEL BIT 1
D0      EXTRACTION CHANNEL BIT 0

Fig.25

| INSERTION ADDRESS REGISTER (A5-A1 = 11000) ||||||||
|---|---|---|---|---|---|---|---|
| D7 | D6 | D5 | D4 | D3 | D2 | D1 | D0 |
| UN-USED | UN-USED | UN-USED | IA4 | IA3 | IA2 | IA1 | IA0 |

D5-D7 NOT USED
D4      INSERTION CHANNEL BIT 4
D3      INSERTION CHANNEL BIT 3
D2      INSERTION CHANNEL BIT 2
D1      INSERTION CHANNEL BIT 1
D0      INSERTION CHANNEL BIT 0

Fig. 26

INSERTION MS DATA REGISTER (A5-A1 = 11001)

| D7 | D6 | D5 | D4 | D3 | D2 | D1 | D0 |
|---|---|---|---|---|---|---|---|
| UN-USED | UN-USED | UN-USED | USED | ID11 | ID10 | ID9 | ID8 |

```
D5-D7 NOT USED
   D4  INSERTION DATA BIT 11 (A SIGNALING)
   D3  INSERTION DATA BIT 10 (B SIGNALING)
   D2  INSERTION DATA BIT 9  (C SIGNALING)
   D1  INSERTION DATA BIT 8  (D SIGNALING)
```

Fig. 27

56/64KBPS DATALINK ADDRESS REGISTER (A5-A1 = 11011)

| D7 | D6 | D5 | D4 | D3 | D2 | D1 | D0 |
|---|---|---|---|---|---|---|---|
| UN-USED | UN-USED | UN-USED | 5664 A4 | 5664 A3 | 5664 A2 | 5664 A1 | 5664 A0 |

```
D5-D7 NOT USED
   D4  56/64 KBPS DATALINK ADDRESS BIT
   D3  56/64 KBPS DATALINK ADDRESS BIT
   D2  56/64 KBPS DATALINK ADDRESS BIT
   D1  56/64 KBPS DATALINK ADDRESS BIT
```

Fig. 28

TRANSMIT MESSAGE DATA REGISTER (A5-A1 = 01010)

| D7 | D6 | D5 | D4 | D3 | D2 | D1 | D0 |
|---|---|---|---|---|---|---|---|
| TMD7 | TMD6 | TMD5 | TMD4 | TMD3 | TMD2 | TMD1 | TMD0 |

```
D7 TRANSMIT MESSAGE BIT 7
D6 TRANSMIT MESSAGE BIT 6
D5 TRANSMIT MESSAGE BIT 5
D4 TRANSMIT MESSAGE BIT 4
D3 TRANSMIT MESSAGE BIT 3
D2 TRANSMIT MESSAGE BIT 2
D1 TRANSMIT MESSAGE BIT 1
D0 TRANSMIT MESSAGE BIT 0
```

Fig.29

| RECEIVE MESSAGE DATA REGISTER (A5-A1 = 01011, RD) | | | | | | | |
|---|---|---|---|---|---|---|---|
| D7 | D6 | D5 | D4 | D3 | D2 | D1 | D0 |
| RMD7 | RMD6 | RMD5 | RMD4 | RMD3 | RMD2 | RMD1 | RMD0 |

```
D7    RECEIVE MESSAGE BIT 7
D6    RECEIVE MESSAGE BIT 6
D5    RECEIVE MESSAGE BIT 5
D4    RECEIVE MESSAGE BIT 4
D3    RECEIVE MESSAGE BIT 3
D2    RECEIVE MESSAGE BIT 2
D1    RECEIVE MESSAGE BIT 1
D0    RECEIVE MESSAGE BIT 0
```

Fig.30

| TRANSMIT LINK MS SIGNALING CONTROL REGISTER (A5-A1 = 01100) | | | | | | | |
|---|---|---|---|---|---|---|---|
| D7 | D6 | D5 | D4 | D3 | D2 | D1 | D0 |
| TLSC23 | TLSC22 | TLSC21 | TLSC20 | TLSC19 | TLSC18 | TLSC17 | TLSC16 |

D0-D7     CHANNEL 16-23 CONTROL

Fig.31

| TRANSMIT LINK SS CONTROL REGISTER (A5-A1 = 01101) | | | | | | | |
|---|---|---|---|---|---|---|---|
| D7 | D6 | D5 | D4 | D3 | D2 | D1 | D0 |
| TLSC15 | TLSC14 | TLSC13 | TLSC12 | TLSC11 | TLSC10 | TLSC9 | TLSC8 |

D0-D7     CHANNEL 8-15 CONTROL

Fig. 32

| RECEIVE LINK MS SIGNALING DATA REGISTER (A5-A1 = 10010, RO) |||||||||
|---|---|---|---|---|---|---|---|---|
| D7 | D6 | D5 | D4 | D3 | D2 | D1 | D0 |
| TLS C7 | TLS C6 | TLS C5 | TLS C4 | TLS C3 | TLS C2 | TLS C1 | TLS C0 |

Fig. 33

| RECEIVE LINK MS SIGNALING CONTROL REGISTER (A5-A1 = 01111) |||||||||
|---|---|---|---|---|---|---|---|---|
| D7 | D6 | D5 | D4 | D3 | D2 | D1 | D0 |
| RLS C23 | RLS C22 | RLS C21 | RLS C20 | RLS C19 | RLS C18 | RLS C17 | RLS C16 |

D0-D7    CHANNEL 16-23 CONTROL

Fig. 34

| RECEIVE LINK SIGNALING CONTROL REGISTER (A5-A1 = 10000) |||||||||
|---|---|---|---|---|---|---|---|---|
| D7 | D6 | D5 | D4 | D3 | D2 | D1 | D0 |
| RLS C15 | RLS C14 | RLS C13 | RLS C12 | RLS C11 | RLS C10 | RLS C9 | RLS C8 |

D0-D7    CHANNEL 8-15 CONTROL

Fig. 35

| RECEIVE LINK LS SIGNALING CONTROL REGISTER (A5-A1 = 10001) |||||||||
|---|---|---|---|---|---|---|---|---|
| D7 | D6 | D5 | D4 | D3 | D2 | D1 | D0 |
| RLS C7 | RLS C6 | RLS C5 | RLS C4 | RLS C3 | RLS C2 | RLS C1 | RLS C0 |

D0-D7    CHANNEL 0-7 CONTROL

Fig.36

RECEIVE LINK MS SIGNALING DATA REGISTER (A5-A1 = 10010, RD)

| D7 | D6 | D5 | D4 | D3 | D2 | D1 | D0 |
|---|---|---|---|---|---|---|---|
| RLS D23 | RLS D22 | RLS D21 | RLS D20 | RLS D19 | RLS D18 | RLS D17 | RLS D16 |

D0-D7    CHANNEL 16-23 CONTROL

Fig.37

RECEIVE LINK SS SIGNALING DATA REGISTER (A5-A1 = 10011, RD)

| D7 | D6 | D5 | D4 | D3 | D2 | D1 | D0 |
|---|---|---|---|---|---|---|---|
| RLS D15 | RLS D14 | RLS D13 | RLS D12 | RLS D11 | RLS D10 | RLS D9 | RLS D8 |

D0-D7    CHANNEL 8-15 CONTROL

Fig.38

RECEIVE LINK SS SIGNALING DATA REGISTER (A5-A1 = 10100, RD)

| D7 | D6 | D5 | D4 | D3 | D2 | D1 | D0 |
|---|---|---|---|---|---|---|---|
| RLS D7 | RLS D6 | RLS D5 | RLS D4 | RLS D3 | RLS D2 | RLS D1 | RLS D0 |

Fig.39

EXTRACTION MS DATA REGISTER (A5-A1 = 10110, RD)

| D7 | D6 | D5 | D4 | D3 | D2 | D1 | D0 |
|---|---|---|---|---|---|---|---|
| UN-USED | UN-USED | UN-USED | UN-USED | ED11 | ED10 | ED9 | ED8 |

D4-D7   NOT USED
D3      EXTRACTION DATA BIT 11 (A SIGNALING)
D2      EXTRACTION DATA BIT 10 (B SIGNALING)
D1      EXTRACTION DATA BIT 9 (C SIGNALING)
D0      EXTRACTION DATA BIT 8 (D SIGNALING)

Fig.40

| EXTRACTION LS DATA REGISTER (A5-A1 = 10111, RD) |||||||||
|---|---|---|---|---|---|---|---|---|
| D7 | D6 | D5 | D4 | D3 | D2 | D1 | D0 |
| ED7 | ED6 | ED5 | ED4 | ED3 | ED2 | ED1 | ED0 |

```
D7   EXTRACTION DATA BIT 7 (PCM 7)
D6   EXTRACTION DATA BIT 6 (PCM 6)
D5   EXTRACTION DATA BIT 5 (PCM 5)
D4   EXTRACTION DATA BIT 4 (PCM 4)
D3   EXTRACTION DATA BIT 3 (PCM 3)
D2   EXTRACTION DATA BIT 2 (PCM 2)
D1   EXTRACTION DATA BIT 1 (PCM 1)
D0   EXTRACTION DATA BIT 0 (PCM 0)
```

Fig.41

| INSERTION LS DATA REGISTER (A5-A1 = 11010) |||||||||
|---|---|---|---|---|---|---|---|
| D7 | D6 | D5 | D4 | D3 | D2 | D1 | D0 |
| ID7 | ID6 | ID5 | ID4 | ID3 | ID2 | ID1 | ID0 |

```
D7   INSERTION DATA BIT 7 (PCM 7)
D6   INSERTION DATA BIT 6 (PCM 6)
D5   INSERTION DATA BIT 5 (PCM 5)
D4   INSERTION DATA BIT 4 (PCM 4)
D3   INSERTION DATA BIT 3 (PCM 3)
D2   INSERTION DATA BIT 2 (PCM 2)
D1   INSERTION DATA BIT 1 (PCM 1)
D0   INSERTION DATA BIT 0 (PCM 0)
```

Fig.42

| MODE STATUS REGISTER (A5-A1 = 11101, RD) |||||||||
|---|---|---|---|---|---|---|---|
| D7 | D6 | D5 | D4 | D3 | D2 | D1 | D0 |
| UN-USED | UN-USED | UN-USED | UN-USED | UN-USED | UN-USED | RSLR | MSP |

```
D2-D7  NOT USED
D1     RECEIVE SWITCH LINK REQUEST
D0     MASTER/SLAVE- PIN SETTING
```

Fig.43

| CLEAR TIMER/NMI REGISTER (A5-A1 = 11110,RD) |
|---|
| DATA BITS = DON'T CARES-THE ACT OF READING CLEARS TIMERS AND/OR NMI |

PULSE WIDTH MODULATED SELF-CLOCKING AND SELF-SYNCHRONIZING DATA TRANSMISSION AND METHOD FOR A TELEPHONIC COMMUNICATION NETWORK SWITCHING SYSTEM

BACKGROUND OF THE INVENTION

This invention generally relates to a switching system for controlling communication between transceiving informational sources of a telecommunications network and, more specifically, to such a system in which timing synchronizational information is encoded directly in the digital information being transceived.

In a modern digital telephonic switching system, audio signals between individual subscriber units are PCM encoded and transceived on a time division multiplexing basis. Circuits know as network termination units have means for interfacing with a group of analog or digital telephone lines and segmenting these lines into corresponding group of channels, or time slots, of a time division multiplexing system. The voice information or digital data on any incoming telephone line of the group is assigned to and is successively provided during corresponding ones of a group of time slots for switching to other transceiving units of the system. The data which is in the plural time slots is then provided to a control unit for switching information from any incoming channel to a selected outgoing channel. These control units also contain central processing elements for controlling this switching operation and also provide a central time base for synchronization of the switching operations.

Thus, it can be appreciated that there are several distinct types of information which must be conveyed between each of the control units and their associated network termination unit. The clock reference from the central time base must be transmitted from the control unit to the network termination unit in order to maintain the network termination unit in frequency synchronization with the centrol time base of the control unit. A phase reference must be passed from the control unit to the network termination unit in order to maintain the network termination unit in phase synchronization with the central time base of the control unit. There, of course, must be a voice or data path from the network termination unit to the control unit and vice versa. A control data link must also be provided between the network termination unit and the control unit for both passing messages to the network termination unit to control its operation and, on the other hand, to pass messages from the network termination unit to the control in response to commands from the control unit.

If a separate wire were used for each of the above types of information, six different wires would be required per control unit, network termination unit pair. In a large switching system, even presuming twenty-four channels per network termination unit, the total number of wires, or connections, would be excessive. This fact has become more significant as the size of the individual control and network termination units decreases due to circuit miniaturization which reduces the space available for wire connectors for those units. Accordingly, there is a strongly felt need to reduce the number of wire connections between control and network termination unit pairs to a minimum.

It is, of course, generally known to use time division multiplexing to reduce the number of wires required for coveying different types of information. Referring to FIG. 1A, a data encoding scheme commonly referred to as Manchester coding, or biphase unipolar encoding is also known in which synchronized information is inherently carried by the data being transmitted, i.e. is self-clocking, so a single wire can simultaneously carry both data and clock information. Binary ones and zeros are represented by negative and positive transitions, and, although a transition occurs once during each cycle, whether the transition will be positive or negative is indeterminate, thereby requiring detection for both types of transitions for full clock extraction. Moreover, the transitions occur during the middle of the clock period instead of at the beginning of each cycle. Another scheme known as RZ (return to zero) binary bipolar coding is also self-clocking. However, it undesirably requires a bipolar voltage source, since binary ones and zeros are represented by positive and negative voltage pulses during the start of each cycle which is incompatible with most modern day telephonic switching circuitry. A system known as RZ binary unipolar coding does not require a bipolar source, but it is only partially self-clocking, since pulses do not occur during each clock cycle. A clock detection for such an RZ data source is shown in U.S. Pat. No. 3,894,246 issued Jul. 8, 1973 to Torgrim and assigned to the assignee of this invention. No other coding schemes using a pulse format are known which are self-clocking or which provide for phase synchronization and, thus any known unipolar data line will have to be accompanied by a companion synchronization line.

SUMMARY OF THE INVENTION

It is, therefore, the object of the present invention to provide apparatus and methods for synchronous, digital communication in which a digital pulse width modulated encoding scheme is employed which overcomes the disadvantages of using the known self-clocking encoding schemes. Non-self clocking binary signal are pulse width encoded to generate a data stream which is unipolar, capable of providing transitions of predetermined sense (positive, preferably, or negative) and which is completely self-clocking, a pulse width modulated pulse being generated at the beginning of each clock cycle. In its most basic application, binary ones correspond to pulses having one width and binary zeros correspond to positive pulses of another width. In order to obtain phase synchronization, as well as timing synchronization, a third pulse of a width differing from the widths of binary ones and binary zeros is generated as a phase synchronization pulse once during each byte or twice during other blocks of data.

Employing the above encoding scheme of the invention for data and clock pulses, an advantageous method of communicating in a synchronous digital communicating network is provided which enables full duplex, synchronous communication between any two termination points in the network through a single pair of wire connections without need of additional connections for either clock pulses or phase synchronization pulses. According to this method, a series of digital pulses in nonself-clocking format from one termination point is converted to the self-clocking format noted above in which binary ones, binary zeros and phase synchronization pulses are respectively represented by pulses of varying widths before being transmitted to another termination point. At the other termination point, a clock signal is extracted from the positive transitions of the pulses which occur at the beginning of each clock cycle; this extracted clock signal is then used to decode the pulse width modulated data pulse back to a nonself-clocking format. The synchronization pulses are used to maintain phase synchronization between the termination points.

The objective of the invention is also achieved in part in the application of the above method in switching systems for controlling communication between sources of a telecommunications network of transceiving informational sources. According to one aspect of the invention, the switching system has a control unit connected with some of the sources and a network termination unit connected with other ones of the sources. The control unit includes means for encoding information from said sources in a serial, pulse width binary format and means for serially transmitting pulse width binary encoded pulses of said encoding information at a preselected transmission bit rate. The network termination unit includes means responsive to the serially transmitted, pulse width binary encoded pulses to extract therefrom a clock signal and means responsive to said clock signal for synchronous decoding of the serially transmitted, pulse width binary encoded pulses for provision to said other ones of said sources connected with the network termination unit.

In keeping with another aspect of the invention, the network termination unit also has an encoder for encoding data from the sources connected therewith into a pulse format and means responsive to the clock signal for transmitting the encoding data to the control unit in frequency synchronism with said transmission bit rate.

It is also an object of the invention to provide a switching system in which synchronization pulses are employed to enable both timing and phase synchronization. In this system, the control unit has means for encoding information from said sources as a series of data pulses, means for generating pulse width encoded synchronization pulses, and means for transmitting said series of data pulses and pulse width encoded synchronization pulses together on a time division multiplexing basis at a preselected bit rate. The network termination unit has means responsive to at least said pulse width encoded synchronization pulses to derive a clock signal, means responsive to said clock signal for synchronous decoding of the series of data pulses for connection to said other ones of the sources connected with the network termination unit, and means responsive to said pulse width encoded synchronization pulses to control synchronization of the synchronous decoding means of the network termination unit with the encoding means of the control unit.

Preferably, the network termination unit has means for transmitting data from the other ones of the sources connected thereto to the control unit. This includes means responsive to said synchronization pulses for maintaining said data transmitted to the control unit in phase synchronization with the pulse width encoded synchronization pulses from the control unit. A phase synchronization acquisition circuit is provided which includes means associated with said decoding means for generating synchronization pulse receipt signals in response to receipt of said synchronization pulses from the control unit, a counter of said encoding means responsive to said synchronization pulse receipt signals to count clock pulses in phase synchronism with the synchronization pulses, means responsive to said counter for generating a synchronization control signal to indicate when the next synchronization pulse should be received if the counter is in phase synchronism with the synchronization pulses, and means responsive to said synchronization pulse receipt signal and said synchronization control signal not being generated within a preselected time period of one another for generating an out-of-sync signal. Means responsive to the out-of-sync signal being provided to resynchronize the counter.

Preferably, full duplex synchronous communication is provided between the control unit and the network termination unit. This objective is achieved by providing the control unit with means for encoding information from a series of data pulses, means for decoding information received in a series of data pulses, means for generating synchronization pulses of a preselected width differing from those of the data pulses, and means for transmitting said encoded information and said synchronization pulses together at a preselected bit rate. Similarly, the network termination unit includes means responsive to at least said synchronization pulses to derive a clock signal, means responsive to said clock signal for synchronous encoding and transmission of information form said other one of the sources to the control unit, and means responsive to said synchronization pulses to control phase synchronization of the encoding and transmitting means of said network termination unit with said decoding means of the control unit.

BRIEF DESCRIPTION OF THE DRAWINGS

The foregoing objects and advantageous features will be described and further advantageous features and objects of the invention will be made apparent from the detailed description of the preferred embodiment which will be given with reference to several figures of the drawing, in which:

FIG. 1A is a table of prior art comparative waveforms of different encoding schemes including all known self-clocking encoding schemes discussed above in the background section;

FIG. 3 is a block diagram of a telephonic network in which the invention is employed;

FIG. 4A is a block diagram of the digital port circuit of the network of FIG. 3 in which a network link interface circuit of the invention is employed as a network termination unit;

FIG. 4B is a block diagram of the the NSC functional block of FIG. 3 in which network link interface circuit of the invention is employed as a control unit;

FIG. 6C depicts illustrative comparative waveforms of different designated points in the receive link section of FIGS. 6A and 6B;

FIG. 7C depicts comparative waveforms at various designated points in the receiver link decoder section of FIG. 7B;

FIG. 7D depicts illustrative comparative waveforms at different designated points in the transmit link encoder section of FIG. 7A and of the receive link decoder in FIG. 7B;

FIG. 10 illustrates the signal to various mode pins and master/slave pin of the network link interface circuit of FIG. 8 required to achieve different modes of operation required for the different applications shown in FIG. 9;

FIGS. 14-43 show the contents of various registers of the network link interface circuit of FIG. 8.

DETAILED DESCRIPTION

Figure 1B:
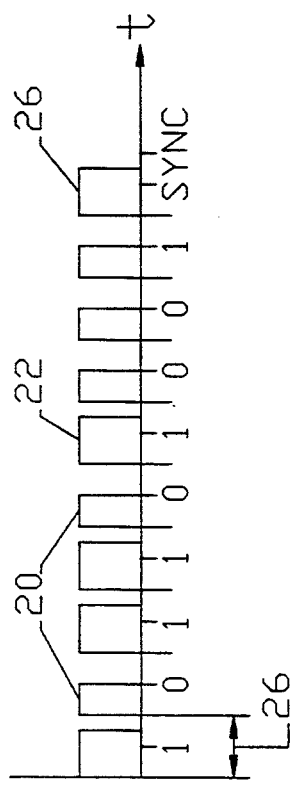
FIG. 1B is an illustration of the binary code represented by the waveforms of FIG. 1A as represented using the binary encoding scheme of the present invention.
Figure 2:
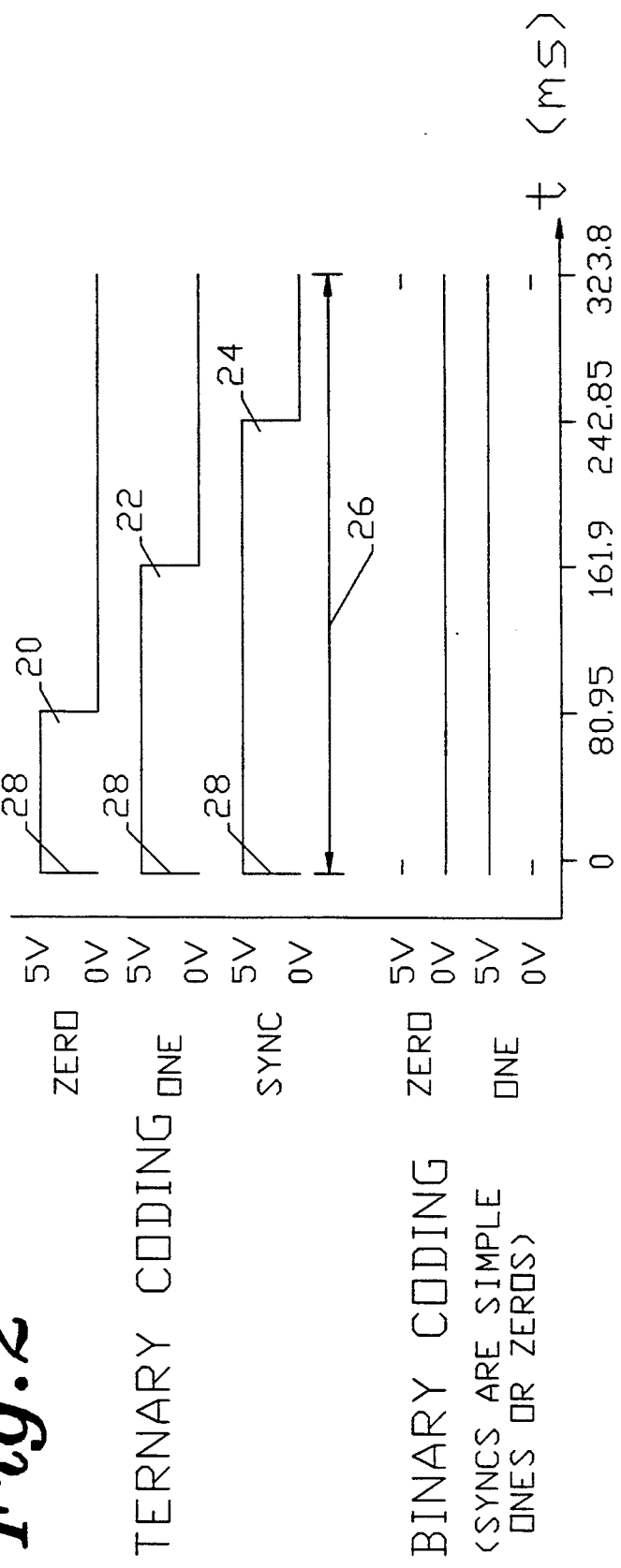
FIG. 2 is a table of waveforms which more clearly illustrate the preferred ternary encoding scheme of the invention.

Referring now to the drawing, particularly FIGS. 1B and 2, the ternary encoding system which enables the many advantageous features of the invention is seen to employ pulses of three different widths. Preferably, the logic zero pulse 20 has the narrowest width, the logic one pulse 22 has the next largest width, approximately twice that of the logic zero pulse 20, and the synchronization, or sync, pulse 24 has the largest width, approximately three times that of the logic zero pulse 20. The entire clock period 26 is preferably four times the width of the logic zero pulse, so that at least one-fourth of the clock period remains without a logic one pulse even when a sync pulse 24 is generated. Unlike other systems shown in FIG. 1A, the leading edge of the pulse 20, 22 or 24 coincide with the start of each timing period and the time between the leading edges of successive pulses is always equal to the clock period 26. Also, a code pulse is generated for each and every clock pulse.

Referring now to FIG. 3, the invention is employed to interface various elements of a network subsystem 29 which, in turn, is connected with an SBX bus 30 of a control subsystem, and the elements of a network termination subsystem. Communication of the elements of the subsystem with a central controller and a central memory (not shown) of the telephonic switching system is through means of an SBX bus 30. The control subsystem of bus 30 is preferably a 68020/68030 microprocessor based multiprocessor, distributed processing system which is capable of either simplex or duplex operation. The network subsystem 29 consists of a system clock, or CLK, 32 and four interactive switching-/control modes (only two shown), each comprising a single stage, non-blocking, 772 channel time slot interchanger, or TSI, 34. Most of these channels (768) are broken down into thirty-two groups of twenty-four channels for interface over high speed serial interfaces known as network links to transition circuits of the network termination subsystem 27. A network shelf controller, or NSC, circuit 36 connected to the TSI 34 has a 68000 microprocessor with two Mbytes of DRAM to provide processing capability of signaling activity on the 768 channels of each switch mode. Within the NSC circuit 36, the 768 channel parallel time division multiplexing, or TDM, bus to and from the TSI circuit (not shown) is multiplexed into a thirty-two, twenty-four channel 3.088 MHz serial links, or network links, to and from the network termination subsystem 27. The TSI circuit 34 provides access to higher level processing for itself and the NSC circuit 36 via an SBX interface (not shown) to an SBX circuit residing on the control subsystem secondary bus 30. The central controller memory and central controller are loaded via this secondary bus 30.

The circuits which form the network termination subsystem 27 include a DAS, or digital audio source, 37 for providing tones, announcements and messages; a basic rate line, or BRL, circuit 38; a primary rate interface circuit, or PRI, 40; one or more DS1 port circuits 42; and a digital signal processing, or DSP, circuit 44. The BRL circuit 38 provides system access to agent and supervisor consoles, while the PRI circuit 40 provides termination of the twenty-fourth 64 Kbit channel of the TI digital trunk and also has all the features of a DS1 port circuit 42. The DS1 port circuit 42 provides digital Tl trunk access into the system. PCM channels are appropriately formatted and delivered to a DS1 transmit link 46. Incoming information from the DS1 link 46 are recovered, buffered and delivered to network links for access to the network. The digital signal processing circuit 44 provides three separate TMS 320C25 digital signal processor based circuits for accessing eight of the twenty-four system channels that the DSP circuit 44 accesses over its link into the network. The DSP 44 processor receives functions for MF and DTMF signals and can also be used for tone metering functions in system diagnostics. As seen, advantageously a linkage 47 of only four wires connects each of the elements of the network termination subsystem 27 with the NSC 36 for a differential system or only two wires in a nondifferential system.

Figure 8:
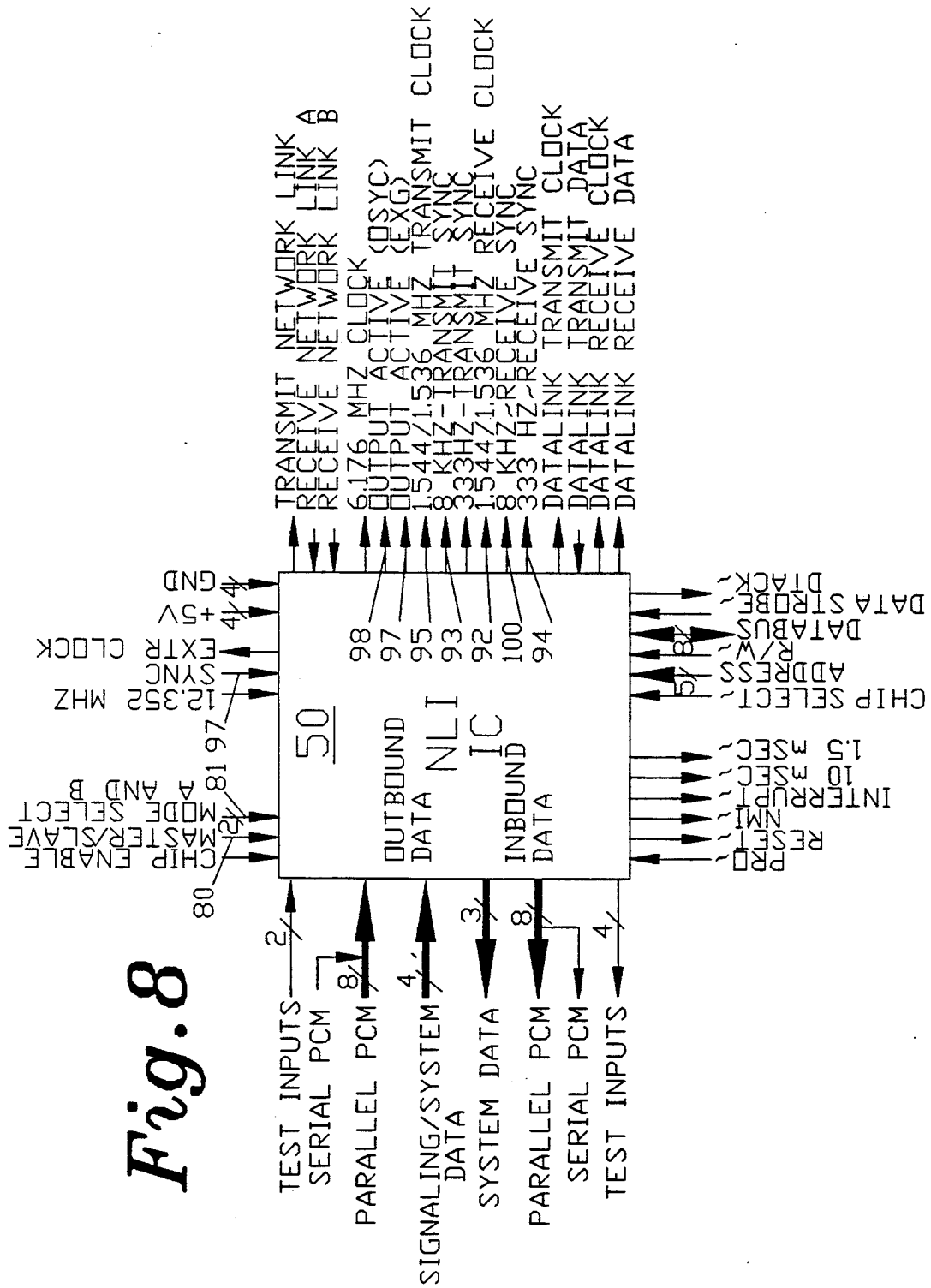
FIG. 8 is a block diagram of a network link interface integrated circuit of FIGS. 4A and 4B illustrating the various inputs and outputs of FIGS. 4A and 4B.
Figure 9:
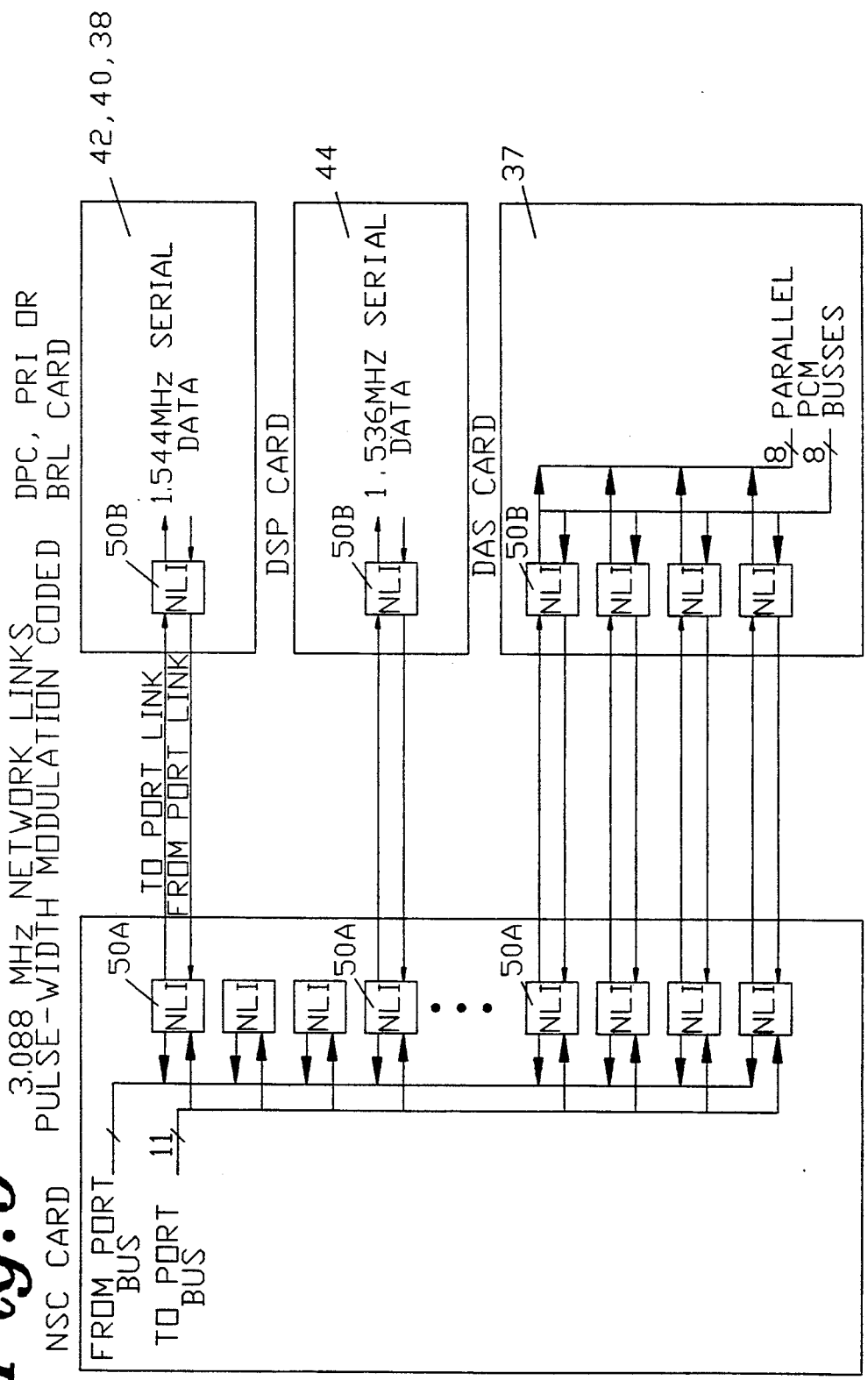
FIG. 9 is a block diagram of a system configuration in which the network link interface circuit of FIG. 8 is variously employed.

The wire linkages 47 are made possible by virtue of use of network link interface, or NLI, integrated circuits 50 of FIG. 8. As seen in FIG. 9, one or more NLI circuits 50, operating as network termination units 50B, are contained in each of the network termination subsystem elements 37, 38, 40, 42 and 44 and multiple NLI circuits, operating as control units 50A are contained in the NSC circuit 36 of the subsystem 29. Thus, the invention is preferably implemented through means of a single NLI circuit 50 which, as will be explained in more detail, is capable of operation in different modes depending upon the application in which it is employed. Preferably, the NLI circuit is implemented in a large scale integrated circuit package having the input and output terminals shown in FIG. 8, although separate integrated circuit packages for each of the different modes of operation could be provided in lieu of a single package.

Referring to FIG. 4A for purposes of illustration, the network link interface circuit 50 is shown being used as a network termination unit, or slave, circuit 50B to interface one of the DS1 port circuits 42, FIG. 8, with another network link interface circuit 50, FIG. 9, operating as a control unit, or master unit, 50A.

The DPC 42 provides termination for a single DS1 trunk, interfacing its twenty-four channels into the network. The DPC 42 provides for received DS1 clock recovery, framing control, buffering of received PCM and AB(CD) signaling data, as well as DS1 line performance monitoring. Through the elastic buffer 53, the received DS1 line's PCM and signaling data received on the DS1 line 46 is synchronized with the a system clock appearing on line 51A. The data read from the elastic buffer 53 is transmitted on a network link 47 to the network. Information to be delivered to the outgoing DS1 line 46 is similarly received from the network on a network link 47. The microprocessor monitors bit-error rate and slip performance of the DS1 line, monitors for alarm conditions, controls loopback and other diagnostic facilities, and maintains communication with the control system via a datalink provided in the network link 47.

The received DS1 signal from an office repeater bay (ORB), channel service unit (CSU), or galaxy voice circuit (GVC) port interface equipment is transformer-coupled and terminated on the DPC 42, as shown. Similarly, each DS1 signal transmitted is transformer-coupled to the line. Three VLSI devices form the core of the DS1 interface function of the DPC 50B: the line interface unit 51, the DS1 transceiver 52, and the elastic buffer 53. These three VLSI devices are programmable by the DPC microprocessor 54.

The DPC's line interface unit 51 provides appropriate termination and line driver circuitry for DS1 line interface 46, in addition to a programmable line build-out function. The line interface unit 51 also recovers the clock signal on the receive line 46A, presenting this clock and the 1.544 MHz serial data thereon to the DS1 transceiver 52 on lines 51A and 51B, respectively. Similarly, the line interface unit 51 will be provided with 1.544 MHz serial data by the DS1 transceiver 52 on line 52A for transmission on the outbound DS1 line 46. The received DS1 line clock extracted by the line interface unit 51 may also be output by the DPC 42 for cabling to clock controlling circuitry of the network (not shown) as a reference input.

The DS1 transceiver 52 locks on to the framing pattern of the receive DS1 line 46A and passes each channel of PCM and signaling data to the elastic buffer 53 device. Bit error counts and alarm conditions of the received DS1 line are maintained by the DS1 transceiver 52. Similarly, PCM and signaling data to be transmitted on the outbound DS1 line 46B are provided by the NLI 50B to the DS1 transceiver 52 for framing.

The elastic buffer 53 buffers the received PCM and signaling information for each channel to allow for variations between DS1 line and system clocks. This data is read from the buffer by the NLI 50B in synchronism with the system clock. Preferably, the elastic buffer device 53 is programmed to perform signaling integration and freeze functions, if desired.

The NSC 36 encodes the system clock and synchronization signals onto the network link 47 and these signals are decoded by the NLI 50B and its associated phase-locked loop circuitry. The NLI 50B provides the mechanism for connecting the twenty-four channels of PCM and signaling data of the DPC 42 with the network. The NLI 50B also provides the means for the microprocessor 54 to communicate with the microprocessor of the NSC 36 over the 768kbps datalink of the network link 47. In redundant systems, the NLI 50B is connected to an NSC 36 in each network copy.

The DPC 40 contains a 68008 microprocessor 54 is a 68008IC operating at six MHz. The major function of the microprocessor 54 is to program the DS1 interface circuitry of the NLI 50B and to monitor the DS1 line 40, reporting error and alarm conditions to the NSC 36. The microprocessor 54 will interact with the NLI 50B for communication with the NSC 36. In such case, the DS1 transceiver 52 will control the facilities data link 51A in ESF DS1 applications. Alternatively, for remote agent applications, the NLI 50B will control a datalink to remote facility 57B maintained in one of the 64 kbps channels of the DPC 42.

The DPC 42 contains sixty-four kbytes of no wait-state EPROM 55 for boot loading and diagnostic code. The DPC 42 contains 32 kbytes of no wait-state RAM 56 which can be optionally expanded to 96 kbytes. The RAM 56 can be write-protected in 8 kbyte blocks. Several registers are also provided in the address space of the microprocessor 54 to allow for control and monitoring of various functions.

The microprocessor 54 can receive interrupts from the NLI 50B, the DS1 transceiver 52, the line interface unit 51, the serial communications controller 57, and by a ten microsecond signal developed in the NLI 50B.

In order to provide for remote agent capability, the DPC 42 is provided with access to one of the twenty-four sixty-four kbps channels of the DS1 line 46 to facilitate 'D' channel control in an ISDN '23B+D' environment. The received sixty-four kbps data is passed by the DS1 transceiver 52 through the NLI 50B to a Z8530 serial communications device, or data links 57A and 57B, controlled by the microprocessor 54. The devices 57 will serialize the sixty-four kbps data stream and pass this through the NLI 50B to the DS1 transceiver 52 for transmission to the outbound DS1 line 46B. At a remote site, another DPC 42 will be present as the source and sink of this 'D' channel information.

The DPC accepts redundant −48 VDC inputs and contains a DCto-DC power converter to derive the +5V required for its logic circuits.

Referring now to FIG. 4B, the NLI 50A is seen as used as a master, or control unit, 50A in the NSC 36 for interfacing the network subsystem 29 with elements of the network termination subsystem 27 of FIG. 3. The NSC 36 occupies a mid-level position in the three-tier distributed processing architecture of the switching network. The major role of the NSC 36 is in call processing during which it interacts with a higher order microprocessors of the control system through means of an SBX interface shared with a TSI 34 with which it is associated. The NSC 36 also interacts with the DAS 37 and DSP 44 in the network termination subsystem 27 through means of network links. AB(CD) signaling bits of lines and trunks and Special-B signaling messages of thin-wire consoles (Special B signaling) are directly controlled by the NSC microprocessor 58. The 'ABSB IC' ASIC has been developed to facilitate the NSC control of this signaling information. The NLI 50A is an ASIC which has been developed to provide communication between the network and network termination elements. The NSC 36 contains thirty-two NLI 50A.

The NSC is controlled by a 68000 microprocessor 58 operating at 10 MHz. The NSC 36 contains 64 kbytes of EPROM 59 accessible with one wait-state for boot-loading and diagnostic code. The circuit also contains 2

Mbytes of DRAM 60 accessible with no wait-states, organized as 1MX16. Parity is also kept on byte boundaries throughout the DRAM 60. Software can be downloaded to this DRAM 60 and then executed. Protection logic 61 allows eight kbyte segments of the DRAM 60 to be write protected, specified as either supervisor or user space, and be restricted from allowing opcode fetches. Any attempt to violate the protection specified for a given DRAM segment will result in a bus error indication to the microprocessor 58.

A 68901 multi-function peripheral 62 is available on the NSC which contains four eight-bit counters which can be arranged to provide two sixteen-bit counters. A serial port 62A on the peripheral facilitates an off-card communications link. This serial link is employed by the NSC in a control/network channel for communication with a clock in another channel. This serial link is employed in downloading the clock during system initialization and as the means for its intercommunication with the control system microprocessors (not shown). I/O pins on the microprocessor 58 are used as prioritized interrupt inputs and as latches for error indications coming from the memory protection logic 61. The NSC microprocessor 58 can receive interrupts from the SBX interface, from the NLIs 50A, from the serial communication circuitry of the microprocessor 58, and by a ten millisecond signal developed in one of the NLIs 50A.

The NSC/TSI interface to an SBX must respond to control signals and communicate via multiplexed address and data buses. Several registers are present on the TSI 34 as part of the SBX interface. The NSC 36 and TSI 34 can be forced to reset by the SBX when a bit in one of these registered is toggled. The SBX can also interrupt the NSC microprocessor 58 by activating certain other bits in these registers. Additionally, a 1 k word, dual-port RAM accessible by the SBX is present in the TSI 34. This dual-port RAM is expressly for the purpose of passing control messages and data between the control system and NSC card microprocessor 58. Although simultaneous access from both directions into this dual-port RAM is possible, data will only be transferred through this memory with a softword-controlled handshake.

Circuitry on the TSI 34 must also convert between SBX bus word-oriented parity and NSC/TSI byte-oriented parity.

Each NSC 36 contains an array of thirty-two NLIs 50A. The NLIs 50A bring together the switched PCM and signaling data (to and from the TSI 34), the system clock and sync signals, and a communications link between the NSC 36 and a network termination card microprocessor onto one physical link. There are three interfaces into the NLI array. Each NLI 50A operates on a twenty-four channel group. For each NLI 50A on an NSC 36, there is an NLI 50B on a network termination circuit with which it is associated.

Network links are employed between the NSC 50 and each network termination circuit. By employing a network link for each twenty-four channel group, a maximum failure group size of twenty-four channels is facilitated in duplex systems. In such duplex arrangements, a given network termination circuit will have network links to each of two redundant NSCs 36. The network termination circuit will always transmit to both NSC 36 copies, but can only be "listening to" one of them at a time.

Minimally, two physical wires would be required for any complete link between the NSC 36 and a network termination circuit: a PCM/signaling data path from the NSC 36 to the network termination circuit and a PCM/signaling data path form the network termination circuit to the NSC 36. Beyond PCM and signaling paths, each card that resides in the network termination subsystem 27 must also be provided with thre additional elements for proper operation: the system clock, a system synchronization signal, and a path for communication with the network control microprocessors (not shown). While in many systems these three signal paths are provided on physically separate wires beyond those reserved for PCM and signaling data. Advantageously, in the network of FIG. 3, the lines are designed to provide these functions inherently on the same set of wires provided for PCM and signaling data flow. Since only these two wires would be required from NSC and network termination connection, a second set of wires is available for the purpose of differtially transmitting each of the signals, thus adding to the reliability of the network links while still keeping the amount of cabling required in to a minimum.

The network link interface integrated circuit, or NLI, 50 is an application-specific integrated circuit designed for controlling the network links as described above. The 3.088 MHz, differential link connecting the NSC 36 to a network termination circuit is referred to as the to port link; that connecting the network termination card to the NSC is called the from-port link.

As the NLIs 50A at the NSC 36 end of a network link have direct access to the system clock provided from the clock, they are said to operate in the "master" timing mode. The NLI 50A must derive copy of the system clock from the pulse-width modulation encoded network link that it receives. The network termination circuits NLIs 50B are thus said to operate in "slave" timing mode. At the network termination circuit, a phase-locked loop is used to recreate the 12.352 MHz system clock from the 3.088 MHz timing pulses on its received network link. This clock is used to sample the encoded data on the received network link where 333 Hz system sync pulses, the twenty-four channel PCM and associated signaling data, and a 768 kbps communication channel are multiplexed. Since the network termination circuits clock is, in this fashion, synchronized with the system clock, there is no need for a similar clock recovery scheme on the NSC circuit 50A of decoding its received network link—the data may merely be sampled by the 12.352 MHz clock provided by the master clock. There is, however, a thirty foot limitation on the length of network link cabling for this latter point to prevail due to phase delays and noise problems associated with longer cables. Practically speaking, this maximum cable length is not a limiting factor since network and network termination functions can be easily located within the distance of one another.

Each of the network termination circuits has its own form of interface to the NLI 50B for passing twenty-four channel data. The NLI 50B preferably provided with "mode" selection pins in order for the card on which it resides to specify the desired twenty-four channel interface required.

Figure 5:
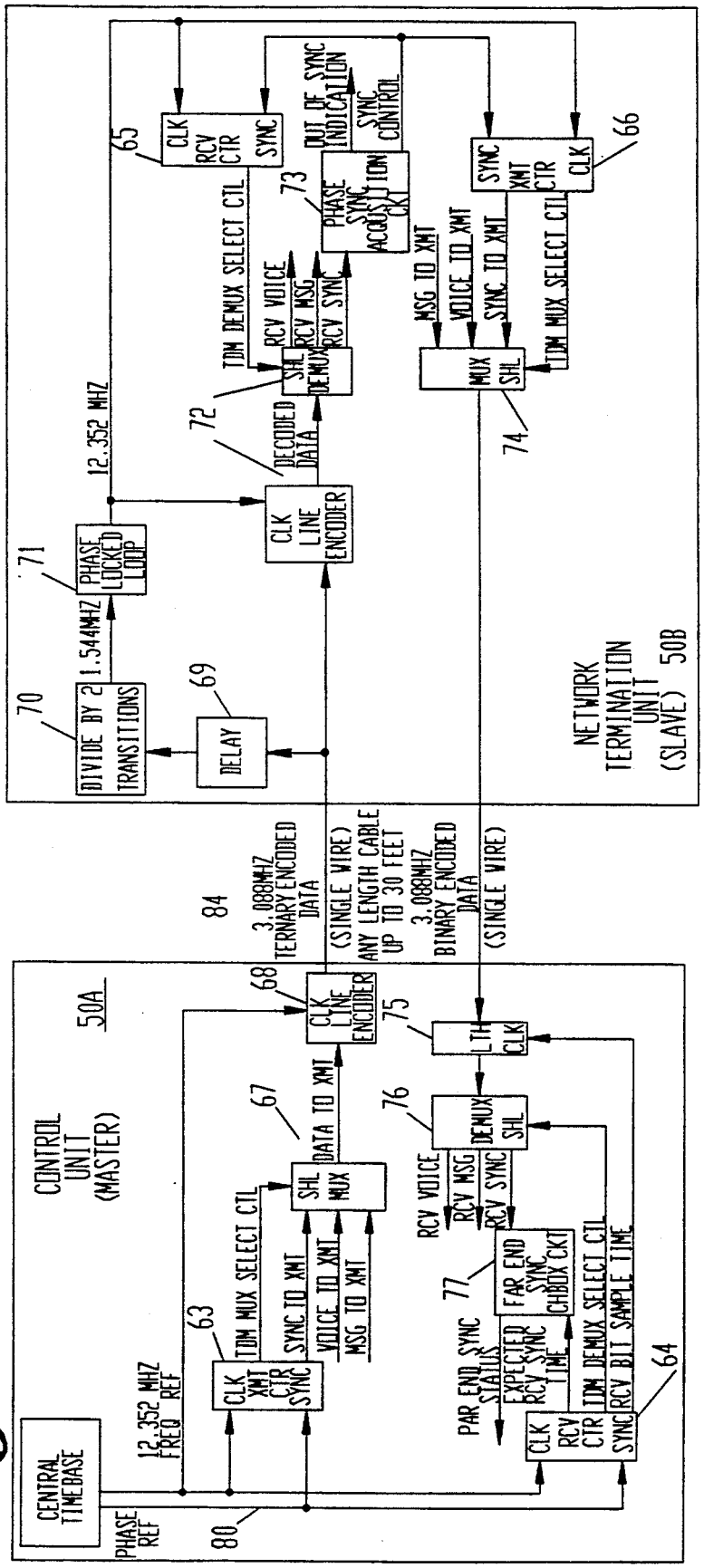
FIG. 5 is a simplified block diagram of the network link interface circuit operating as a control unit in the NSC circuit of FIG. 4B and the network link interface circuit functioning as a network termination unit in the digital port circuit of FIG. 4A.

Referring now to FIG. 5, an NLI circuit 50 operating as a control unit, or master unit, 50A within an NSC 36 is shown simply connected with another NLI circuit 50 of a DPC 42 which has been preselected to operate as a network termination unit, or slave unit, 50B.

At the NSC 50A, a 12.352 MHz frequency reference and a 333 Hz phase reference are provided to the NLI 50A on lines 80 and 82. Two sets of fixed-modulus counters 63 and 64 are driven by these reference inputs. The 12.352 MHz frequency reference is provided to each of these counters as the clock input; the 333 Hz phase reference is provided to each as the sync (reload) input. The modulus of the XMT counter 63 is exactly the same as that of the RCV counter 64. Each consists of two stages with the first stage being an eleven bit counter that ranges on successive clock inputs from counts zero to 1543 and a second stage being a five bit counter ranging from zero to twenty-three. The first stage of each counter must range from zero through 1543 before the second stage is allowed to increment one time. When the first stage counter reaches count 1543, the next received 12.352 MHz clock input will cause that counter to go to zero. Similarly, when the second stage counter reaches count twenty-three, the next time that the first stage counter is at its maximum value and a 12.352 MHz clock is received, the second stage count will revert to zero. Registers are maintained within the NLI 50A as input to these counters. FIGS. 20 and 23 indicate the registers addressable by the microprocessor 58, FIG. 4B, which effect counter operation. Upon the initialization of these registers by the microprocessor 58, each time that the 333 Hz phase reference input on line 80 is received by the XMT counter 63 and RCV counter 64, the values from these registers are inserted as the next count of those counters. In this fashion, the microprocessor 58 can specify a phase difference between the XMT counter 63 and RCV counter 64 simply by specifying a different value in the associated counter load registers for each. This is useful as at the NLI 50B, where there is similarly an XMT counter 65 and a receive counter 66. The modulus of these counters is exactly the same as those on the NSC 50A. The XMT counter 66 and RCV counter 65 of the NLI 50B differ from those on the NLI 50A only in the way that 12.352 MHz clock and 333 Hz sync is applied to them and, potentially, in the counter load register values that their microprocessors of therir associated circuits have set for them once 333 Hz sync is received.

At the NLI 50A, voice and control message data is applied as input to a multiplexer 67 for ultimate transmission to the network termination circuit. Outputs of the XMT counter 63 are used to selet which of these inputs are to be applied to the line encoder 68. A third input to the multiplexer will be another output of the XMT counter 63 indicating that it is time to present a 333 Hz sync signal on the transmitted network link. The line encoder will act on either the logic zero or logic one data from the voice or control message inputs to produce the encoded logic zero or logic one symbols in FIG. 2. When it receives an input indicating that a sync symbol should be transmitted to the network link, it produces the sync symbol of FIG. 2.

At the network termination end, 50B, the output of the NLI line encoder 68 is received after propogation through the interconnecting wire 84. This received network link data is passed through a delay network 69 and then input to a divide-by-two circuit 70 such as a toggle flip-flop. Since each symbol received from the network link begins with a low-to-high transition, the received network link, once delayed, is used as the clock input of this toggle flip-flop 70. The result is a 1.544 MHz clock as input from the divide-by-two circuit 70 which is, in turn applied as input to a phase-locked loop 71 to create a 12.352 MHz clock. A property of this 12.352 MHz output from the phase-locked loop 71 is that it is four times higher in frequency than the 3.088 MHz data rate of the received network link and that every fourth low-to-high edge of this 12.352 MHz clock will lag in phase behind the low-to-high edge beginning each received bit interval of the received network link. The duration of this phase lag is essentially fixed as the duration of the delay block 69.

In this fashion, the 12.352 MHz clock can be used to sample each received network link bit interval four times to discern which of the three symbols was output by the NSC line encoder 68 in a given bit interval. This sampling and decoding of the received bit is the function of the line decoder and demultiplex circuits 72. The 12.352 MHz clock developed by the phase-locked loop 71 is used as the clock input to the RCV counter 65 and XMT counter 66 at the network termination circuit. When the line decoder and demultiplex circuits 72 identify that a sync input has been received from the incoming network link, this sync indication is applied to the sync (reload) input of the RCV counter 65 and the XMT counter 66 through means of the phase sync acquisition circuit 73.

Since both the RCV counter 65 and XMT counter 66 operate in a fixed modulus and since the value that they take on when a sync is received is fixed by the microprocessor of the associated network termination circuit by loading the associated counter load registers (FIGS. 20 through 23), the phase sync acquisition circuit 73 can compare the current value of each counter against its load register values to predict that a sync symbol should be received as the next input bit from the incoming network link. Sould either the next bit received from the incoming network link not be a sync symbol, an out-of-sync condition is indicated at the network termination circuit. Should a sync symbol be received ont he incoming network link and it not be predicted by a comparison of either counters current values to its load value, again an out-of-sync condition is indicated at the network termination circuit.

Once the RCV counter 65 and XMT counter 66 on the network termination initially achieve synchronization with the NSC 36, they should remain the sync thereafter. In a synchronized condition, the RCV counter 65 will output a signal used to demultiplex the decoded voice and control message data received to appropriate card circuitry from the line decoder and demultiplex circuit 72. Similarly, voice and control message data to be transmitted to the NSC 36 will be presented from other network termination card circuitry to a multiplexer 74 for network link transmission. The XMT counter 66 will provide another input to this multiplexer 74 for insertion during sync bit intervals on the transmitted network link. A XMT counter 66 output will control which bit, whether voice, control message, or sync type, is to be transmitted at a given time.

On the other hand, it is important to note that the transmitted network link data from the network termination NLI 50B is not pulse-width modulation encoded. This output is strictly logic zero or logic one throughout the 3.088 MHz bit interval. The XMT counter 66 will cause the sync bits to output to the network link to formulate a unique patterns of logic zeroes and logic ones.

The RCV counter 65 on the network termination NLI 50B is clearly frequency synchronized to its XMT counter 66. The phase difference between these two counters is controlled by the termination circuits microprocessor by specifying the value on receiving a sync input. Similarly, the XMT counter 63 at the NSC 36 is clearly frequency synchronized to its RCV counter 64, and the phase difference is controlled by the microprocessor 58 setting of the values when sync is applied. Since the RCV counter 65 is synchronized to the XMT counter 63 of the NLI 50A by our pulse-width modulation scheme, the network termination XMT counter 66 is synchronized to the RCV counter 64. The entire system is thus frequency synchronized and, with appropriate values in all counter's 63–66 load registers, phase synchronized is achieved, as well.

For purposes of a illustration, consider the time delay along the path of a bit output by the line encoder 68 of NLI 50A at the NSC 36, propogating through the network link cable to the network termination circuit DSP 44, propogating through the line decoder and demultiplexer 72, being looped back as input to the transmit multiplexer 74, propogating through the multiplexer and inerconnecting network link cable back to the NSC, and being received at the input latch 75. If the length of the interconnecting cable is limited, with the circuitry of FIG. 5, the round trip interval can be less than one 3.088 MHz bit interval. It is this circuitry and method of FIG. 5 with its inherent synchronization and controlled time delay that allows simple receipt of the non-encoded network link data transmitted from the network termination multiplexer 74 with a latch 75 at the NSC 36. This latch 75 is clocked with a 3.088 MHz signal derived by the NSC RCV counter 64 by simple division of the 12.352 MHz clock that RCV counter 64 receives. The instant which begins a 3.088 MHz output bit interval by the NSC line encoder 68 is the same instant that a bit is sampled and received by its received network link latch 75.

The data received by the NSC latch 75 is demultiplexed to go to the appropriate NSC circuitry by a demultiplexer 76 controlled by an output of the RCV counter 64. Further, since the entire system is in synchronization, it is known when to expect sync bits at the NSC end from the network termination end. The farend sync check circuit 77 receives input from the RCV counter 64 to identify those instants when logic one level sync bits should be received from the network termination end and then samples the received network link bits output from the demultiplexer 76. Should the far-end sync check circuit 77 discern that a logic one sync bit was either not received from the network link when it was expected or was received when it was not expected, an indication that the network termination end 50B is out of sync with respect to the NSC end 50A will result and the NSC microprocessor 58 will be interrupted.

Figure 6A:
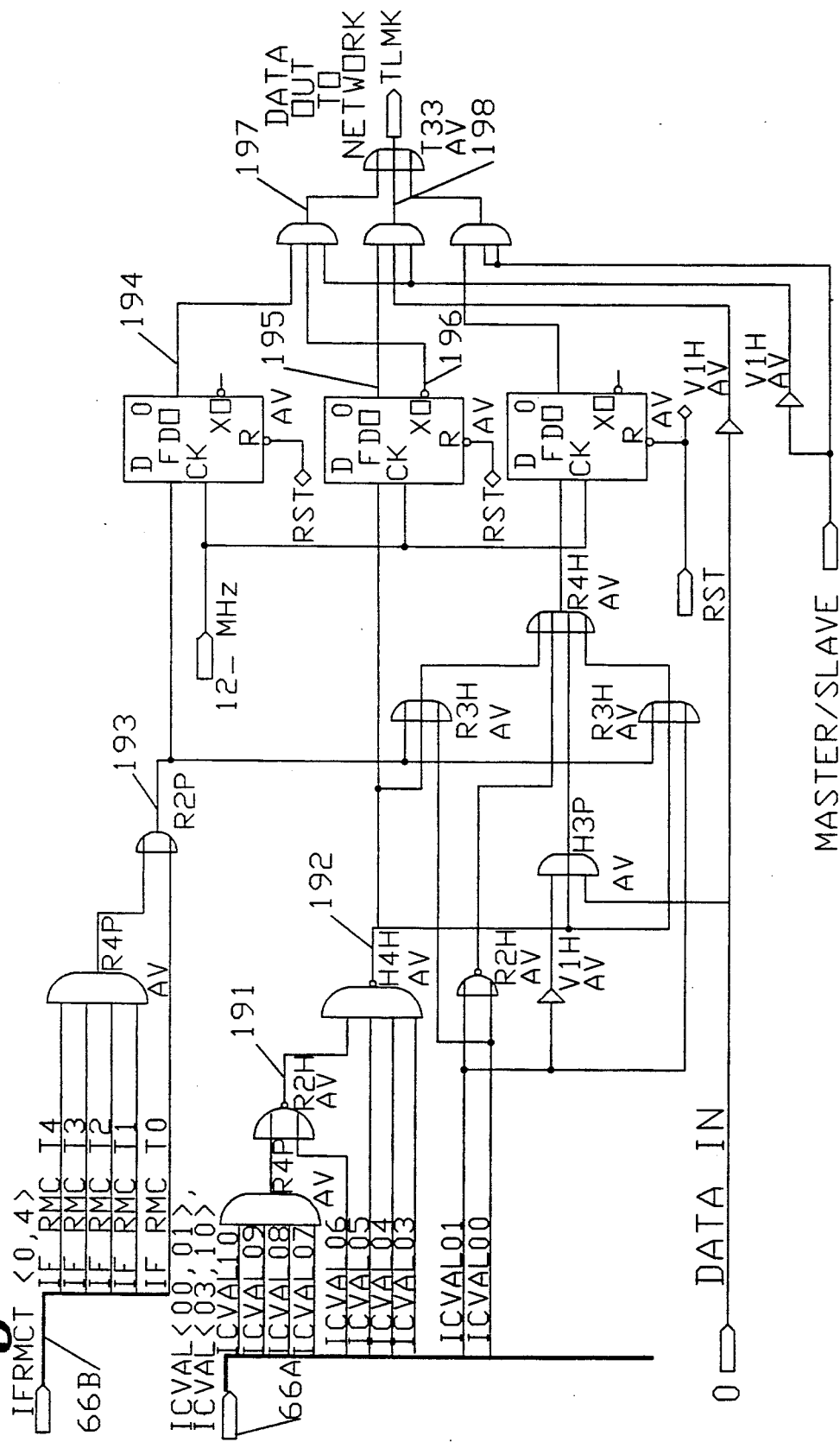
FIG. 6A is a circuit diagram of the transmit link encoder section of the network termination unit of FIG. 5.
Figure 6B:
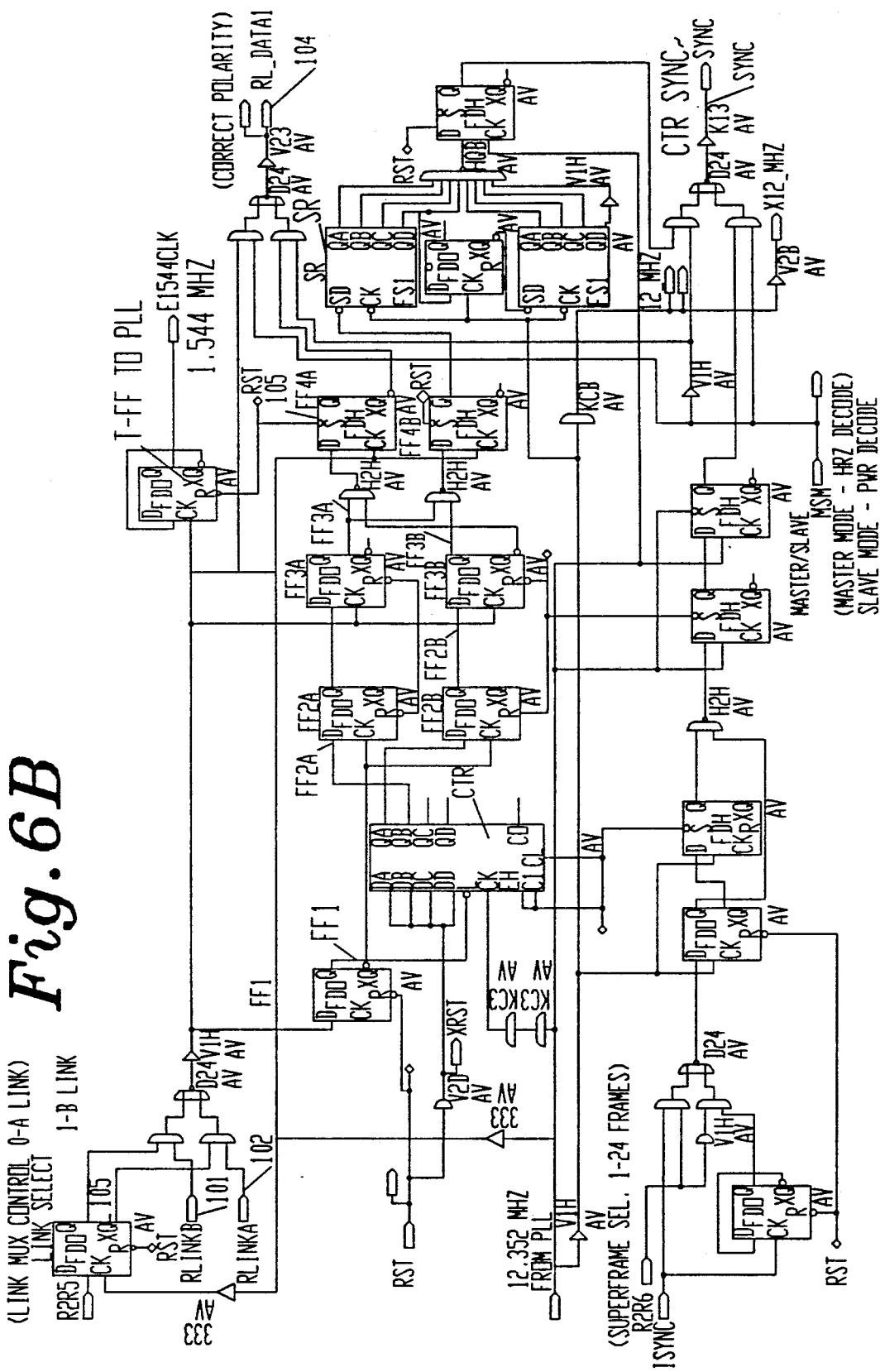
FIG. 6B is a circuit diagram of the receive link section of the network termination unit of FIG. 5.

Referring to FIGS. 6A and 6B, the transmit link section and receive link section of the network termination, or slave, unit 50B are seen. These operate in association with the waveforms shown in FIGS. 6C, 6D, 6E and 6F of the drawing.

Figure 7A:
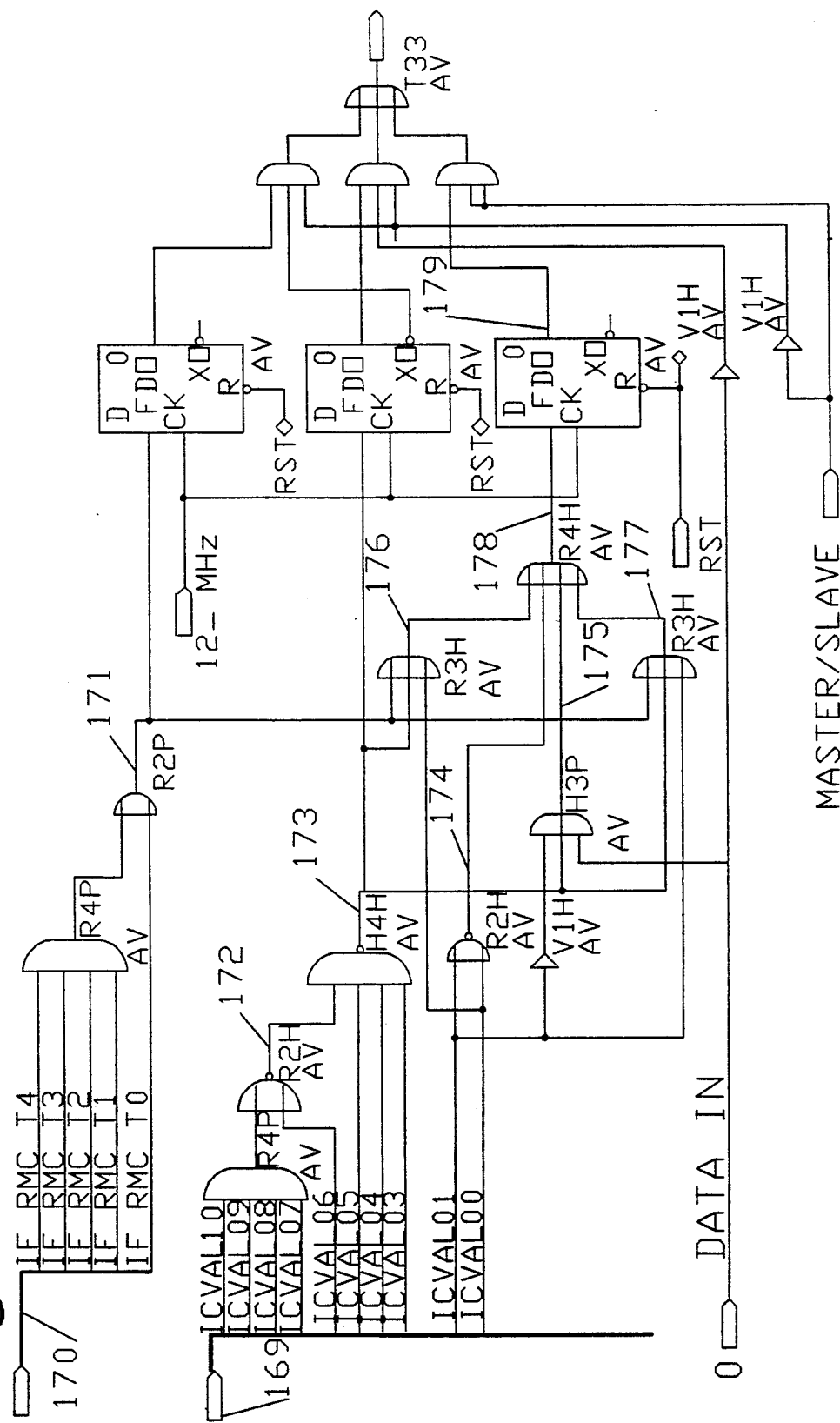
FIG. 7A is a circuit diagram of the transmit link encoder section of the control unit of FIG. 5.

The circuitry of FIG. 6A is incorporated together with that of FIG. 7A in one integrated circuit. Also, different portions of the circitry in FIG. 6A (7A) are applicable when the device is employed on the NSC end is a network link interface 50A than would be the case if the device were employed in the network termination end as in an NLI 50B. Similarly, different portions of the circuitry in FIG. 6B(7B) are applicable when the device is employed at the NSC end as a network link interface 50A than would be the case if the device were employed at the network termination end as an NLI 50B.

In FIG. 6A, the relevant points of the network link transmitter of the network termination end 50B have been labelled A1 through A7. It is presumed that the master/slave pin of the NLI 50, FIG. 8, is fixed to logic zero (indicating slave mode) in this application, enabling the appropriate NLI 50B portion of the circuitry of the NLI 50. The NLI receives input from the fixed-modulus XMT counter 66. The XMT counter 66, FIG. 5, consists of two stages with its first stage being an 11 bit counter that ranges on successive clock inputs from counts 0 to 1543 and its second stage a five bit counter ranging from 0 to 23. The first stage of each counter must range from 0 through 1543, and the second stage is a five bit counter ranging from 0 to 23. The first stage of each counter must range from 0 through 1543 before the second stage is allowed to increment one time. When the first stage counter reaches count 1543, the next received clock input will cause that counter to go to zero. Similarly, when the second stage counter reaches count 23, the next time that the first stage counter is at its maximum value and clock is received, the second stage count will revert to 0. The first stage counter outputs 66A are labelled ICVAL00 through ICVAL10 on FIG. 6A, but outputs ICVAL02 and ICVAL03 are unused. The second stage counter outputs 66B are labelled IFRMCT0 through IFRMCT4 on FIG. 6A. The XMT counter 66 is clocked by the low to high edge of an inverted copy of the same 12.352 MHz clock plus which forced XMT counter 66 outputs to go to a state with ICVAL00, ICVAL01=00.

Essentially, signals at 197 and 198 are NORed together to provide a network link bit output lasting one 3.088 MHz period. If output 195 is low then output 196 is high. When output 195 is high, the data input to the circuit labelled DATA IN will be whatever is transmitted on the network link. If output 196 is high, however, the output will be whatever is also on output 194. The output 194 signal is the means whereby sync bits are output to the network link from the network termination NLI 50B to the NSC NLI 50A, with a unique pattern being maintained. Output 194 is equal to the value of output 193 sampled after the output 193 signal has settled from the change in counter state. Similarlly, output 195 is equal to the value of output 192 sampled after the output 192 signal has settled from the change in counter state. Also, output 196 is the complement of output 195.

The following combinational logic expressions serve to fully describe the operation of the relevant protion of the circuit:

| Output | Condition |
|---|---|
| 191=1 only when | [ICVAL10-ICVAL00]=00000XXXXXX where X=irrelevant |
| 192=0 only when | [ICVAL10-ICVAL00]=00000111XXX where X=irrelevant |
| 193=0 only when | [IFRMCT4-IFRMCT0]=00000 |
| 194=0 only when | [IFRMCT4-IFRMCT0]=00000 when sampled by 12.352 MHz |
| 195=0 only when | [ICVAL10-ICVAL00]=00000111XXX when sampled by 12.352 MHz where X=irrelevant |

-continued

| Output | Condition |
|---|---|
| 196=inverse of 195 | |
| 197=1 only when | |
| | [IFRMCT4-IFRMCT0]not=00000 when sampled by 12.352 MHz |
| | AND |
| | [ICVAL10-ICVAL00]=00000111XXX when sampled by 12.352 MHz |
| | where X=don't care |
| 198=1 only when | |
| | [ICVAL10-ICVAL00]not=00000111XXX when sampled by 12.352 |
| | MHz where X=irrelevant |
| | AND |
| | "DATA IN"=0 |
| such that "DATA OUT TO NETWORK LINK" takes on the following values: | |
| if [ICVAL10-ICVAL00]=00000111XXX when sampled by 12.352 MHz where | |
| X=irrelevant, | |
| "DATA OUT TO NETWORK LINK"=0 when [IFRMCT4-IFRMCT0]not=00000 | |
| when sampled by 12.352 Mhz | |
| if [ICVAL10-ICVAL00]not=00000111XXX when sampled by 12.352 MHz | |
| X=don't care, | |
| "DATA OUT TO NETWORK LINK"=0 when "DATA IN"=0 | |

Referring to FIG. 6B, the network link receiver of the network termination end NLI 50B has the master/slave input at logic zero (indicating slave mode) to enable the appropriate portion of the circuitry. The data is received from two network links at the associated network termination circuitry. This is in keeping with a strategy for the switching system has redundant NSC circuits. The circuitry will interact with only one of network link 101 and 102 this is selected by the microprocessor 58 setting a link select bit to chose between data on input 101 or 102 link A or RCVD data from network link B. Whichever network link input is accepted, the data output 104 will be controlled by the decoding circuitry shown and will come from the inverting output of the flip-flop 105 of FIG. 6B. This toggle flip-flop 105 is the divide-by-two circuit 70 of FIG. 5. The multiplexing circuitry shown to select between network link copies and the inherent delay of the toggle flip-flop 105 is represented by the delay circuit 69 of FIG. 5. Since the received network link data arrives at 3.088 MHz, the output of flip-flop 105 is a 1.544 MHz clock signal. This 1.544 MHz clock is applied as input to a phase-locked loop 71 to create the 12.352 MHz phase locked loop signal (FROM PLL) signal shown on FIG. 6B and which is used to clock the XMT counter 66 and RCV counter 65. The load input signal (CTR SYNC~) to the XMT counter 66 and the RCV counter 65 is developed by the circuitry shown on FIG. 6B and represents the means whereby system synchronizatiion is achieved. The CTR SYNC~ signal is activated by the circuitry depicted in FIG. 6B upon recipt of sync 24 symbols in the received pulse-width modulation encoded network link data.

Figure 6C:
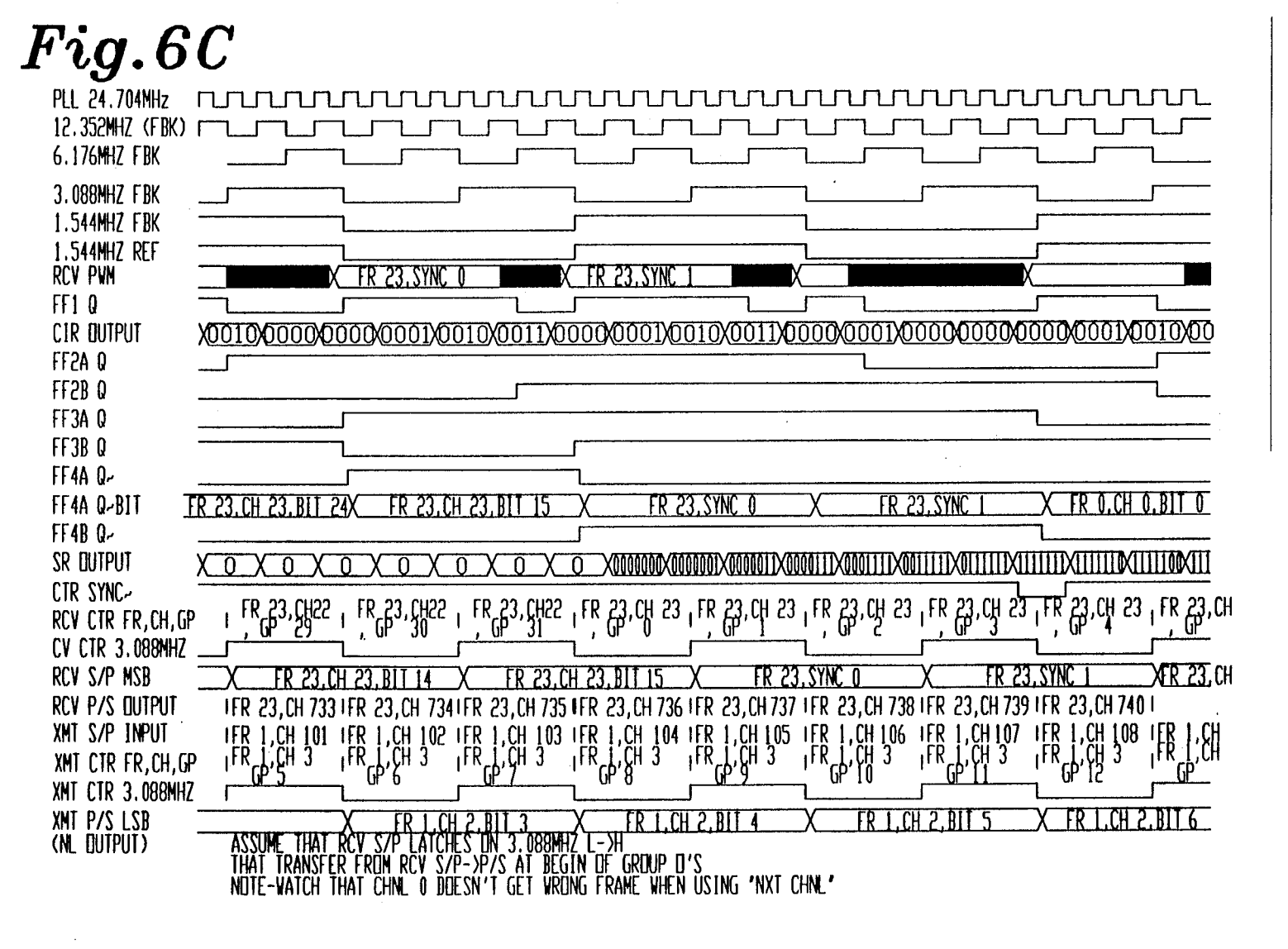
Figure 6D:
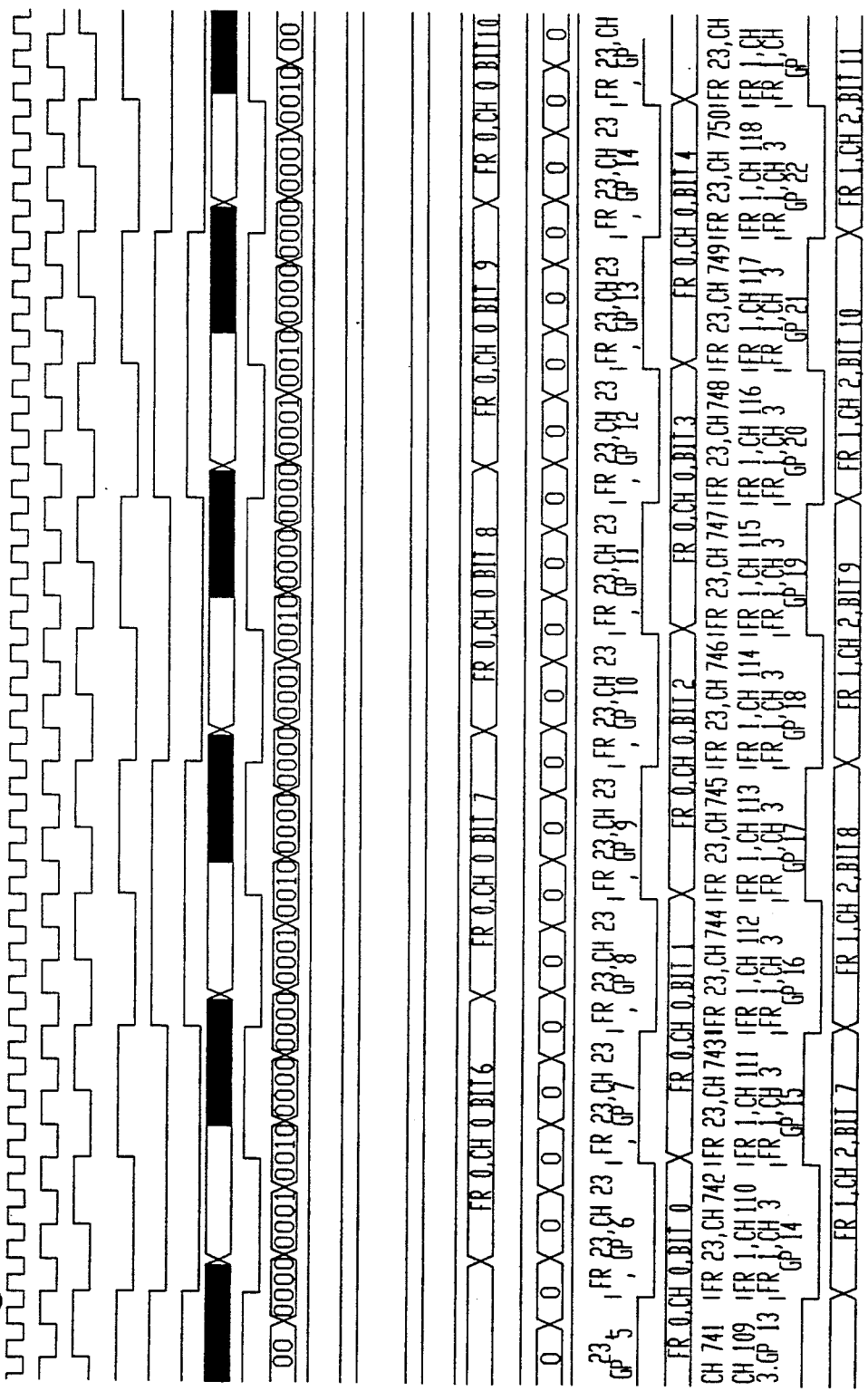
FIG. 6D is a continuation of FIG. 6C.
Figure 6E:
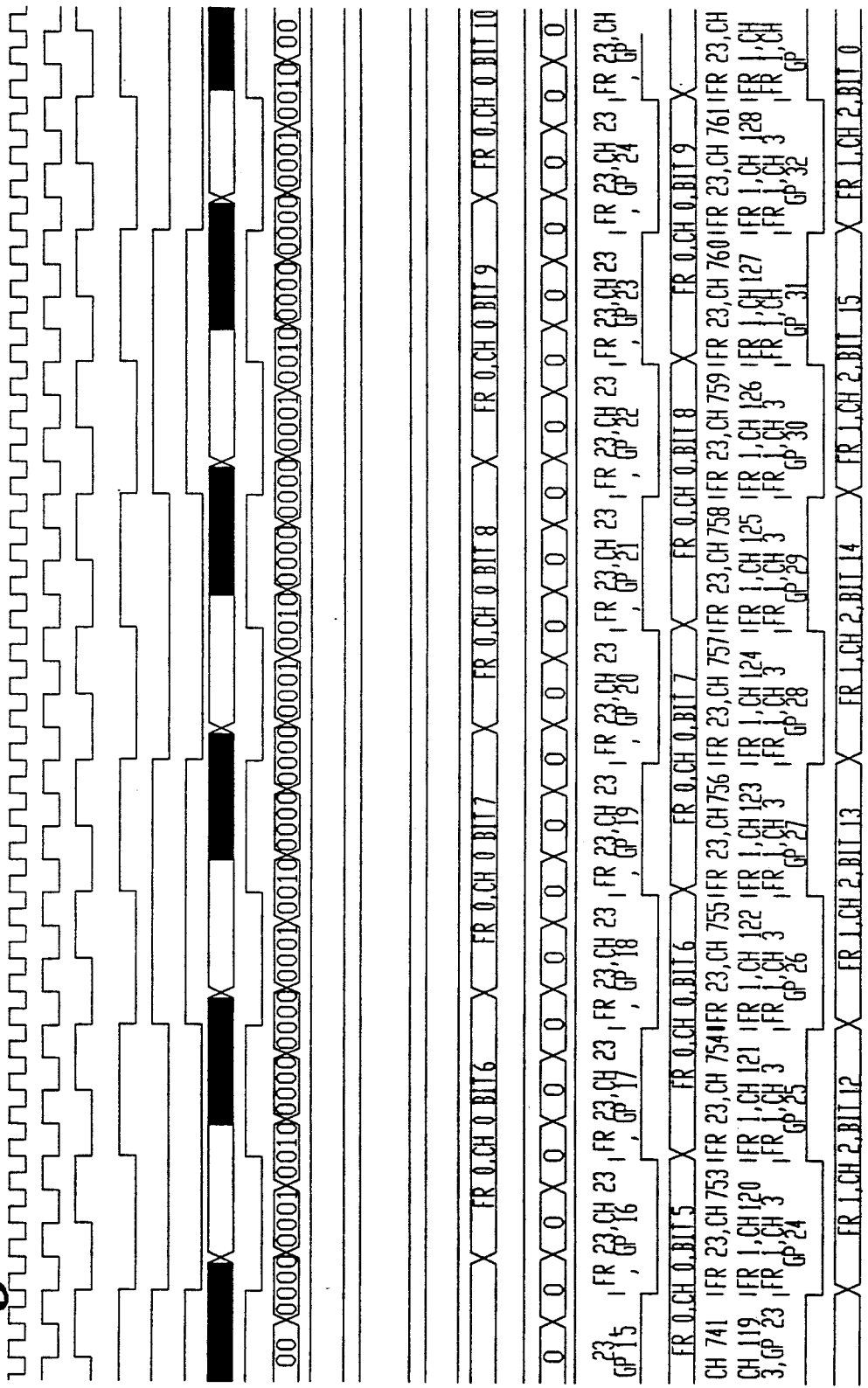
FIG. 6E is a continuation of FIG. 6D.
Figure 6F:
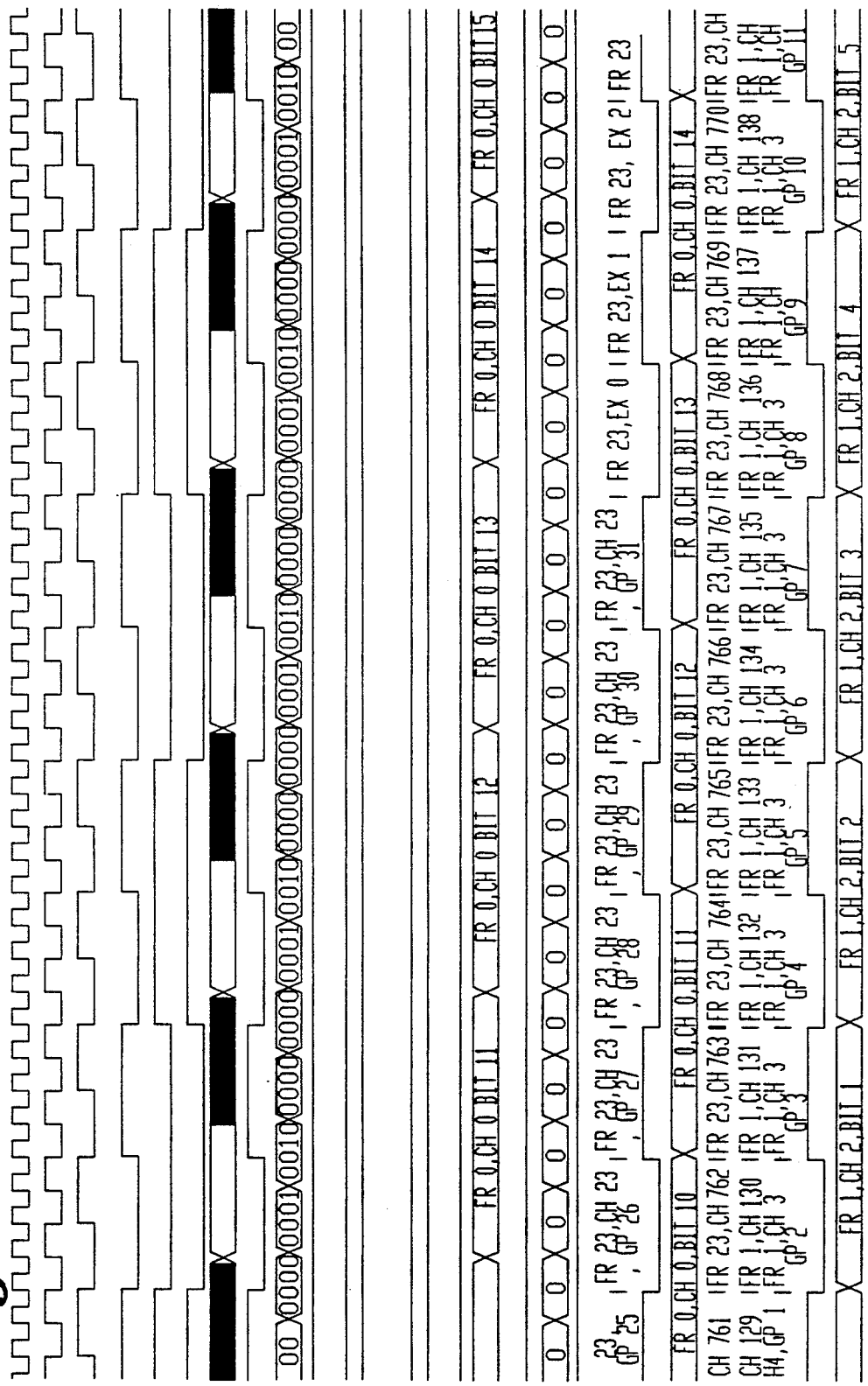
FIG. 6F is a continuation of FIG. 6E.

The operation of the circuitry in FIG. 6B is illustrated in FIGS. 6C through 6F. FIG. 6C depicts the arrival of sync 24 symbols on the received network link and the development of the CTR SYNC~ signal to synchronize the switching system. FIGS. 6D through 6F indicate the continuation of operation during intervals between received sync 24 symbols for clarity. Noting the labelled points in the circuitry of FIG. 6B, it is seen from FIGS. 6C through 6F that:

Line 7 indicates the received network link data. The figure begins with the last portion of a non-sync bit's arrival followed by the arrival of the two consecutive sync 24 symbols. In each bit interval on line 7, the shaded portion represents logic zero and the non-shaded portion represents logic one.

Line 6 represents the T-FF 1.544 MHz output to the phase-locked loop.

Line 1 through 6 represent internal signals of the phase-locked loop, with line 2 indicating the 12.352 MHz clock used by the circuitry in FIG. 6B and line 5 illustrating the phase-locked loop frequency and phase synchronization with the T-FF output of line 6. The 12.352 MHz clock is used either directly or in inverted form to clock the flip-flop, counter, and shift register stages in the circuitry depicted in FIG. 6B.

Line 8 indicates the Q output of FF1. Each pulse-width modulated bit is sampled four times by FF1 in accordance with the high to low transitions of the 12.352 MHz clock. Each pulse-width encoded bit is thus reproduced at the output of FF1 with a slight delay from its actual arrival at the network termination circuit. The Q output of FF1 is applied as the load input to a synchronous four-bit counter which, in turn, is clocked by the low to high transitions of 12.352 MHz. Whenever a logic zero level is termination card. The Q output of FF1 is applied as the load input to a synchronous four-bit counter which, in turn, is clocked by the low-to-high transitions of 12.352 MHz. Whenever a logic zero level is apparent on this counter's load input during a low-to-high transition of 12.352 MHz, the counter's output becomes [QD-QA]=000. Should the counter's load input be logic one during a low-to-high transition of 12.352 MHz, the counter will increment its count by one.

Line 9 indicates the output of the 4-bit counter during successive 12.352 MHz clock cycles when the network link data received conforms to the pattern of line 7. Note that it is only during those intervals where sync 24 symbols are received from the network link that the counter's output reaches the value where sync 24 symbols are received from the network link that the counter's output reaches the value [QD-QA]=0011. Flip-flop FF2A and FF2B receive their D-inputs directly from this counter's output. FF2A and FF2B are clocked by low-to-high transitions on the inverting output (XQ) of FF1. The low-to-high transition on the inverting ouput of FF1 occurs when the delayed and sampled received network link data has reverted from logic one to logic zero, concluding its positive pulse. Flip-flops FF2A and FF2B and succeeding stages will assess at which of the four sample points taken in the 3.088 MHz bit interval this positive pulse concluded in order to decode the received symbol from amongst the set possible 20,22,24.

Lines 10 to 11 indicate the output of FF2A and FF2B, respectively, when the network link data received conforms to the patterns of line 7. Note from FIG. 6B that FF3A and FF3B receive their D-input from FF2A and FF2B, respectively. FF3A and FF3B are clocked by the low-to-high transition of the actual received network link data (delayed by the multiplex circuitry) such that their outputs are updated once every 3.088 MHz interval. In a given 3.088 MHz bit interval, the 4-bit counter counts up once for each of the (up to 3) times that the receive network link data sampled by FF1 is at logic one, FF2A and FF2B and then when the actual network link data transitions from logic one to logic zero, the "highest count" that the 4-bit counter achieved is latched in FF3A and FF3B.

Lines 12 and 13 indicate the output of FF3A and FF3B, respectively, when the network link data received conforms to the patterns of line 7. Flip-flops 4A and 4B are clocked by the high-to-low transitions of the combinational logic which acts on the outputs of FF3A and FF3B. The output of FF4A will be the decoded output of each network link bit to the network termination card's circuitry. FF4A will cause a logic one, indicating that a zero symbol 20 was received. FF4A will cause a logic one to be output to the circuit when both the first and second quarters of a received network link bit interval is logic one, indicating that a zero symbol 20 is received. The output of flip-flop FF4B is fed to an eight bit shift register for the purpose of determining the appropriate time to cause a CTR LOAD~ signal to the XMT counter 66 and the RCV counter 65.

Lines 14 and 16 indicate the output of FF4A and FF4B, respectively, when the network link data received conforms to the pattern of line 7.

Line 17 indicates the output of the 8-bit shift register [SR] which receives input from FF4B and is clocked by low-to-high transitions of the 12.352 MHz clock provided by the phase-locked loop.

Line 18 indicates the CTR SYNC~ signal applied to the XMT counter 66 and the RCV counter 65 to achieve system synchronization. This CTR SYNC~ signal is formulated by sampling the output of the depicted combinational logic driven by the SR outputs after a settling period by low-to-high transitions on the 12.352 MHz clock provided by the phase-locked loop.

The remaining lines on FIGS. 6C through 6F indicate the outputs of the synchronized XMT counter 66 and RCV counter 65. Specifically, by comparing lines 20 and 25 it is shown that the 3.088 MHz bit inerval is maintained in phase on both the received and transmitted network link. The timing diagrams represented in FIGS. 6C through 6F and in FIG. 7D complement each other. Together they mesh and fully describe the timing of the switching system and its particular time-division multiplex strategy. The circuitry described in FIGS. 6A and 6B provide the core of this functionality on the network termination end 50B of the network links.

Figure 7B:
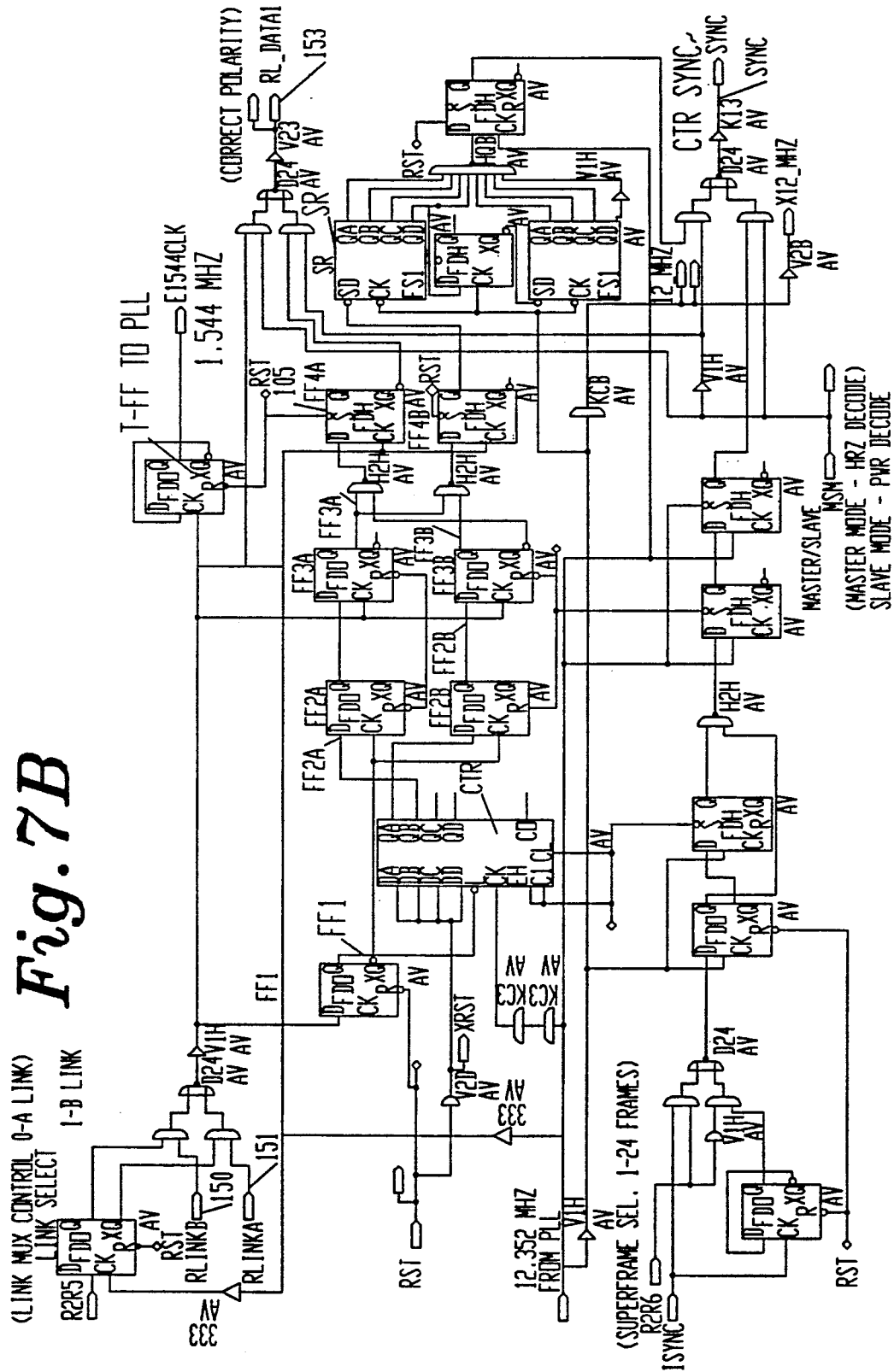
FIG. 7B is a circuit diagram of the receiver link decoder section of the control unit of FIG. 5.

Referring to FIGS. 7A and 7B, the transmit link encoder section and receive link decoder section of the master control unit 50A are shown. These circuits operate in accordance with the waveform shown in FIGS. 7C and 7D.

Referring to FIG. 7A, it is identical to that depicted in FIG. 6A. Similarly, the circuitry depicted in FIG. 7B is identical to that depicted in FIG. 6B. This is the case as they have been fabricated in one integrated circuit. Different portions of the circuitry in FIG. 7A(6A) are applicable when the NLI 50 is employed on the NSC end of a network link than would be the case if the NLI 50 were employed on the network termination end 50B. Similarly, different portions of the circuitry in FIG. 7B(6B) are applicable when the NLI 50 is employed on the NSC end of a network link than would be the case if the device were employed at the network termination end. In FIG. 7A, the master/slave pin of the device is fixed to logic one (indicating master mode), enabling the appropriate portion of the circuitry. The transmitter circuit of FIG. 7A receives input from the fixedmodulus XMT counter 63, FIG. 5. The XMT counter 63 consists of two stages with its first stage being an 11 bit counter that ranges on successive clock input from counts 0 to 1543. The second stage is a five bit ounter ranging from 0 to 23. The first stage of each counter must range from 0 through 1543 bedfore the second stage is allowed to increment one time. When the first stage counter reaches count 23, the next time that the first stage counter outputs are maximum value and clock is received, the second stage count will revert to zero. The first stage counter outputs 171 are referred to as IC-VAL00 through ICVAL10. Outputs ICVAL02 and ICVAL03 are unused. The second stage counter outputs 172 are referred to as IFRMCT0 through IFRMCT4 on FIG. 7A. THe XMT counter 63 is clocked by the low-to-high edge of an inverted copy of the same 12.352 MHz clock in FIG. 5. Further, the data input to the circuit for eventual output to the network link is presented for a full 3.088 MHz interval in phase with the high-to-low edge of the same 12.352 MHz clock pulse which forces XMT counter 63 outputs to go to ICVAL00, ICVAL01=00.

Essentially, the signal at 179 is inverted to provide a network link bit output lasting one 3.088 MHz period. Note that 179 is equal to the value of 178 sampled after the 178 signal has settled from the change in counter state. The 178 signal is formed by NORing the signal 174, 175, 176, and 177. The 174, 175, 176, and 177 signals each play a role in creating the eventual pulsewidth modulated output to the network link. The 174 signal is formulated to insure that the pulse-width modulated output during the first quarter of each 3.088 MHz bit interval is a logic one during sync bit times. The 177 signal is formulated to insure that the second quarter of a 3.088 MHz bit interval is at logic one during sync bit times. The 176 signal is formulated to insure that the third quarter of a 3.088 MHz bit interval is at logic one during sync bit times. The 175 signal is formulated to cause the second quarter of a 3.088 MHz bit interval to be at logic one during non-sync bit times when the data input (DATA IN) to the circuit is itself at logic one; similarly the second quarter of the network link output 3.088 MHz bit interval will be caused to be logic zero when the data input (DATA IN) is itself logic zero during such intervals.

The following combinational logic expressions serve to describe the operation of the relevant portion of the circuit of FIG. 7A:

| Output | Condition |
| --- | --- |
| 171=0 only when | [IFRMCT4-IFRMCT0]=00000 |

-continued

| Output | Condition |
|---|---|
| 172=1 only when | [ICVAL10-ICVAL00]=00000XXXXXX where X=irrelevant |
| 173=0 only when | [ICVAL10-ICVAL00]=00000111XXX where X=irrelevant |
| 174=1 only when | [ICVAL10-ICVAL00]=XXXXXXXXX00 where X=irrelevant |
| 175=1 only when | |
| | [ICVAL10-ICVAL00]not=00000111XXX where X=irrelevant |
| | AND |
| | ICVAL1=0 |
| | AND |
| | "DATA IN"=1 |
| 176=1 only when | |
| | FRMCT=00000 |
| | AND |
| | [ICVAL10-ICVAL00]not=00000111XX0 where X=irrelevant |
| 177=1 only when | |
| | FRMCT=00000 |
| | AND |
| | [ICVAL10-ICVAL00]not=00000111XXX where X=irrelevant |
| | AND |
| | ICVAL1=0 |
| 178=NOR(174, 175, 176, 177) | |
| 179=178 sampled by 12.352 MHz | |
| "DATA OUTPUT TO NETWORK LINK"=complement of 179 | |

Referring to FIG. 7B, the master/slave pin of the NLI 50A is fixed to logic one (indicating master mode) in this application, enabling the appropriate portion of the circuitry. Data comes in from the network link and passes through the NLI 50A and from its data output to the NSC 36 circuitry. The 12.352 MHz clock and 333 Hz (ISYNC) sync inputs to the NLI 50 continues through to where the 12 MHz~ clock and 333 Hz (SYNC) sync signals which clock and load, respectively, both the NLI XMT counter 63 and RCV counter 64 to synchronize the switching system.

In FIG. 7B, the data (RCVD DATA FROM NETWORK LINK) at input 150 is, in fact received in a synchronous fashion in accordance with the overall timing control of the switching system. The the input 152 (INPUT DATA MUX CONTROL) will always be set to logic one by the microprocessor of the NSC 36 to enable the path from input 150 to output 153 (DATA OUTPUT TO CARD CIRCUITRY). Since the data received from the network link on the NSC NLI 50B is not encoded, a property of the method employed is realized in that there is no need for any circuitry to perform decoding.

The overall timing control of the switching system has been described in the discussion of FIG. 5. Some critical elements in achieving the described synchronous operation are depicted in FIG. 7B and are illustrated in the timing diagram of FIG. 7C. Various points on FIG. 7B have been labelled A, B, C, D, E and F and the timing for each is shown in FIG. 7C. In FIG. 7C, the 12.352 MHz clock and 333 Hz (ISYNC) sync signals provided to the circuit are depicted. The nature of those provided signals is that the 12.352 MHz clock toggles indefinitely. Every 37056 12.352 MHz cycles (with is a three msec interval), the ISYNC signal which is normally at logic one transitions to logic zero for an interval lasting two 12.352 MHz cycles with the indicated phase. This pattern of the ISYNC signal similarly continues indefinitely. The XMT counter 63 and RCV counter 64 on the NSC end of the switching system are clocked by an inverted form of this 12.352 MHz signal (12 MHz~). The circuitry of FIG. 7B forms the load signal (SYNC) to phase synchronize these two counters from which system timing control is administered through the indicated stages labelled A through F. The timing of Signals A through F and SYNC are depicted in FIG. 7C relative to the circuit's controlling 12.352 MHz and ISYNC input timing.

FIG. 7D has been provided to indicate the relationship between the circuitry depicted in FIGS. 7A and 7B, the XMT counter 63 and RCV counter 64 of FIG. 5, and the synchronous operation of both the transmitted and received network link data.

Referring to FIG. 7D:

Line 3 indicates the timing of the 12.352 MHz clock input in the circuit of FIG. 7B.

Line 4 indicates the timing of the 333 Hz phase synchronization input to the circuit of FIG. 7B (ISYNC).

Line 6 indicates the 12 MHz~ clock input depicted in FIG. 7B to the XMT counter 63 and RCV counter 64 of FIG. 5 which control the overall timing of the NSC end 50A operation.

Line 7 indicates the 333 Hz [SYNC] phase sync input depicted in FIG. 7B to the XMT counter 63 and RCV counter 64 of FIG. 5 which control the overall timing of the NLI 50A operation.

Line 10 represents a 3.088 MHz output of the RCV counter 64 which, on its low-to-high transition, is used by the latch 75 indicated in FIG. 5 to sample the received network link data at the NLI 50A.

Line 12 represents a 3.088 MHz output of the XMT counter 63 which, on its low-to-high transition, is used by the line encoder 68 indicated in FIG. 5 to begin the network transmission interval of each bit output by the NLI 50A.

Line 13 indicates the timing of network link data received at the NLI 50A by the latch 75 depicted in FIG. 5. The solid area of that line is where data is insured valid, with all propogation delays settled, by the method employed for the switching system.

Lines 14 through 17 indicates the role of each network link bit received in the time-division multiplexed strategy employed in this switching system.

Line 19 indicates the timing of PCM data delivered to the circuitry of FIG. 7A for eventual output to the network link.

Line 21 indicates the role of each network link bit transmitted and its role in the time-division multiplexed strategy employed in this switching system. Each network link bit transmitted is shown to begin with a low-to-high transition of the 3.088 MHz clock indicated on line 12. Pulse-width modulation encoding is enforced on each bit transmitted during these 3.088 MHz intervals.

The timing diagrams represented in FIG. 7D and in FIGS. 6C through 6F complement each other. Together they mesh and fully describe the timing of the switching system and its particular time-division multiplex strategy. The circuitry described in FIGS. 7A and 7B provide the core of this functionality on the NLI 50A.

The NLI 50 of FIG. 8 will generate and control the network links connecting the control subsystem associated with line 30 and network termination shelves, or NSC circuits 36. An NLI 50 will be found on each end of a 3.088 MHz network link, with each NLI 50 handling a pair of links—one for each direction of transmission. On a given card, the NLI 50 will convert the PCM, signaling, and message information passed to it into a serial stream, add some framing and synchronization bits, and transmit this data in encoded form on a network link. In the other direction, the NLI 50 will perform the line decoding and extract PCM, signaling, and message information to hand off to the appropriate card circuitry. The coding employed for data transmitted on a network link from the control subsystem to the network termination unit will be of a pulse width modulation form, with varying length pulses used to represent zeros, ones, and synchronization digits. On the other hand, the coding of network link data sent from the network termination units to the control subsystem will be strictly NRZ, FIG. 1A. There are several forms in which PCM and signaling data may be passed to and from the NLI and separate modes of the device have been defined for each.

Referring again to FIG. 9, each NLI 50 will control twenty-four channels of PCM and signaling data. Since the NSC circuit 36 deals with a 768 channel group, it must have thirty-two NLI circuits 50 on board to handle all channels it must service. The DAS 37, FIG. 3, supports ninety-six channels and, thus, four NLI circuits 50 are required per board. The DPC, PRI, BRL, and DSP circuits each support twenty-four channels, requiring only one NLI circuit 50 per board. In addition to differences in the number of NLI circuits 50 for each of these circuits, there are differences in the way each handles the passing of data to and from its NLI circuit 50 and also in the way the internal timing of each NLI circuit 50 is controlled. FIG. 9 shows how the NLI 50 will be employed in the system of FIG. 3, and FIG. 10 indicates the mode of device data I/O and internal timing control used on each card. The modes of the NLI 50 I/O are specified by hard-wiring NLI mode select pins A and B 81, FIG. 8. Internal timing control of an NLI 50 is fixed by hard-wiring the NLI Master/Slave~pin 80, FIG. 8.

The NLI 50 and NSC circuits 36 will operate in Mode 0, specified by wiring both mode select pins A and B 81 to logic 0. In Mode 0, data for network link transmission is presented as eleven parallel bits consisting of eight PCM and three "system" bits. The three system bits consist of a parity bit, a framing bit, and a superframe-synchronous signaling (SFSS) bit. The same eleven bit parallel format is used for output of data received from a network link. NLI circuits 50 on NSC cards 36 will be provided with a 12.352 MHz clock and a 333 Hz synchronizaiton pulse by a system clock. To use these signals for master timing control, each NLI 50 should have its Master/Slave~pin 80 set to logic one.

NLI circuits 50 on DS1 port 42, PRI 40, and BRL 38 will operate in Mode 1, specified by wiring mode pin A as logic 0 and pin B as logic one. In Mode 1, PCM data for network link transmission is presented as a 1.544MHz serial bit stream. The serial PCM stream is organized in frames consisting of twenty-four eight bit samples, with each such set of 192 bits preceeded by a frame bit. Signaling data in Mode 1 is presented as four parallel inputs (A, B, C, and D) to the NLI 50, concurrent in timing with receipt of the eighth bit of each channel's sample on the serial PCM input stream. In Mode 1, PCM data received from a network link is output by the NLI 50 in the same 1.544 MHz serial format as used for transmission. Signaling data received from the network link will not, however, appear at the NLI pins—this data will replace the least significant bit, or LSB, of the PCM on the serial output stream during the system-defined "signaling frames". It should be noted that the BRL 38 will not use the signaling bit handling features of the NLI 50. NLI circuits 50 on data port circuits 42, PRI circuits 40, and BRL circuits 38 should have their Master/Slave~Pins 80 set to logic zero such that internal timing is controlled by the 12.352 MHz clock provided by the NLI circuits phase-locked loop, FIG. 5, (PLL) in conjunction with synchronization information obtained from the received network link.

NLI circuits 50 on DAS circuits 37 will operate in Mode 2, specified by wiring Mode Pin A as logic one and Pin B as logic zero. In Mode 2, PCM data for network link transmission is presented to the NLI 50 as eight parallel PCM bits. Likewise, data received from a network link will be output from the NLI 50 as eight parallel PCM bits. A-port signaling data will be extracted from the LSB of PCM of each channel on the received link during the system-defined A-port signaling frames and will be stored for eventual reading by the circuits microprocessor. NLI circuits 50 in DAS circuits 37 should have their Master/Slave~pins 80 set to logic zero such that internal timing is controlled by the 12.352 MHz clock provided by the card's phase-locked loop (PLL), FIG. 5, in conjunction with synchronization information obtained from the received network link.

The NLI circuits 50 on DSP circuits 37 will operate in Mode 3, specified by wiring both mode select pins A and B 81 as logic 1. In Mode 3, PCM data for transmission is presented to the NLI 50 as a 1.536 MHz serial data stream consisting of twenty-four eight bit PCM samples. PCM data received from a network link is also output from the NLI as a 1.536 MHz serial data stream consisting of twenty-four 8 bit PCM samples. A-port signaling data will be extracted from the LSB of PCM of each channel on the received link during the system defined A-signaling frames and will be stored for eventual reading by the circuit's microprocessor. NLI 50 on DSP circuits 37 should have their Master/Slave~pins 80 set to logic zero such that internal timing is controlled by the 12.352 MHz clock provided by the circuit's phase-locked loop (PLL), FIG. 5, in conjunction with synchronization information obtained from the received network link.

The NLI 50 performs numerous functions. It converts twenty-four channels of PCM and signaling data into a 3.088 MHz serial bit stream and converts a received 3.088 MHz serial bit stream into PCM and signaling data. It embeds message information into each transmitted network link using a packet protocol and extracts message information from each received link. It also embeds clock into each transmitted network link through use of pulse-width modulated line coding described above, providing link synchronization by embedding "sync" bits 24 in the serial data stream and extracts clock and sync from each received link. PCM and signaling data insertion/extraction registers are provided for background testing, and a signaling store with microprocessor access is provided for received A-signaling bits. There is also a microprocessor interface for message information handling and chip control.

Figure 11:
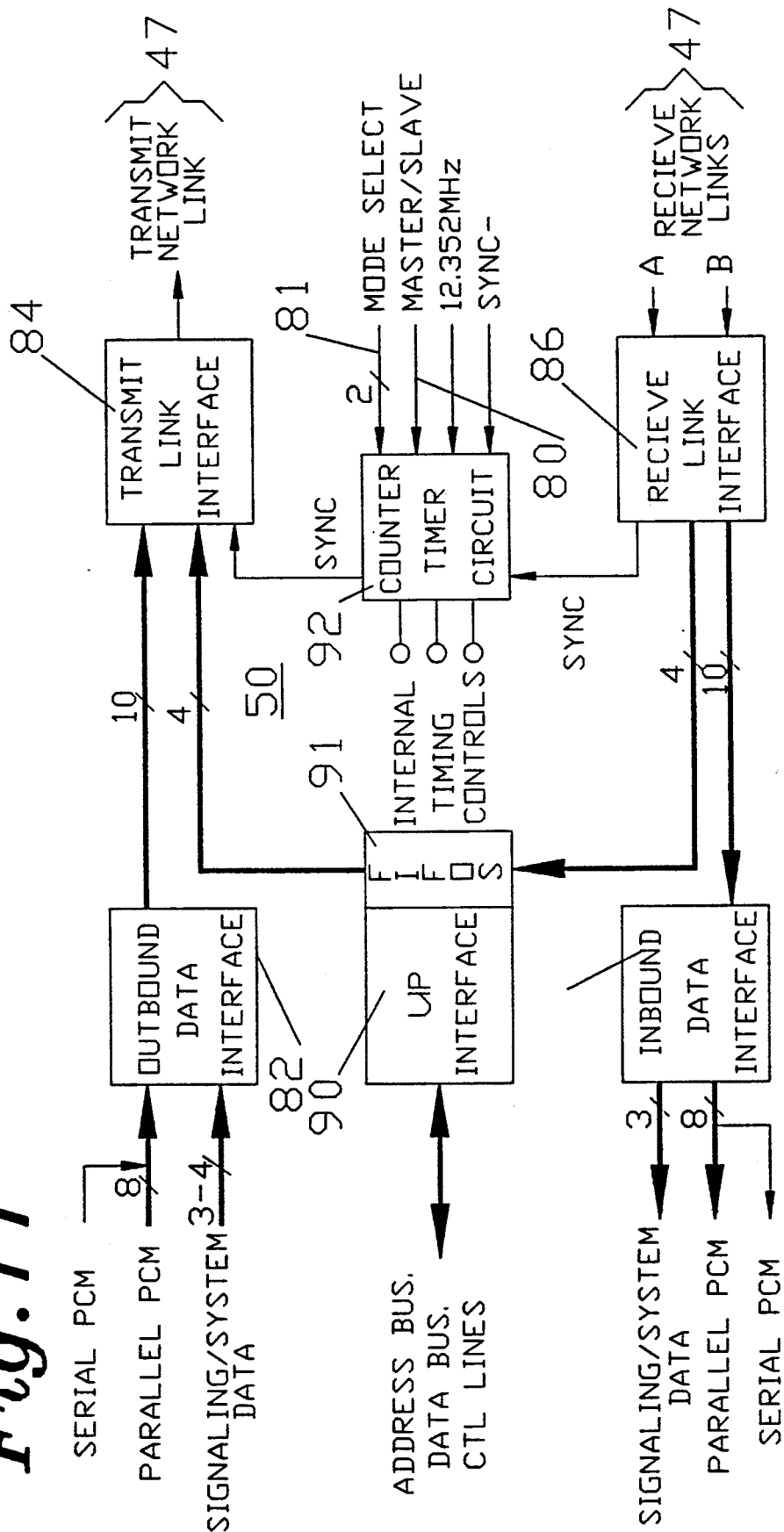
FIG. 11 is another functional block diagram of the network link interface circuit to illustrate the various interfaces it has with other elements of the network.

Referring to FIG. 11, the NLI 50 has five interfaces: an outbound data interface, the transmit link interface 82, the receive link interface 86, an inbound data interface 88, and a microprocessor interface 90. The outbound data interface 82 provides means for a card to hand off PCM and signaling data to be transmitted on a network link. This data is merged with information specified for transmission by the microprocessor interface 90 and is sent in pulse-width modulation encoded form to the outbound network link by the transmit link interface 84. In the other direction, data received form a network link 47 arrives at the receive link interface 86 where PCM and signaling data is extracted and sent to the inbound data interface 88 for output from the NLI 50. Message information is also extracted from the received network link 47 and is routed to the microprocessor interface 90. The connections between the microprocessor interface 90 and both the receive and transmit interfaces 86 and 84 are made via FIFOs 91.

Figure 12:
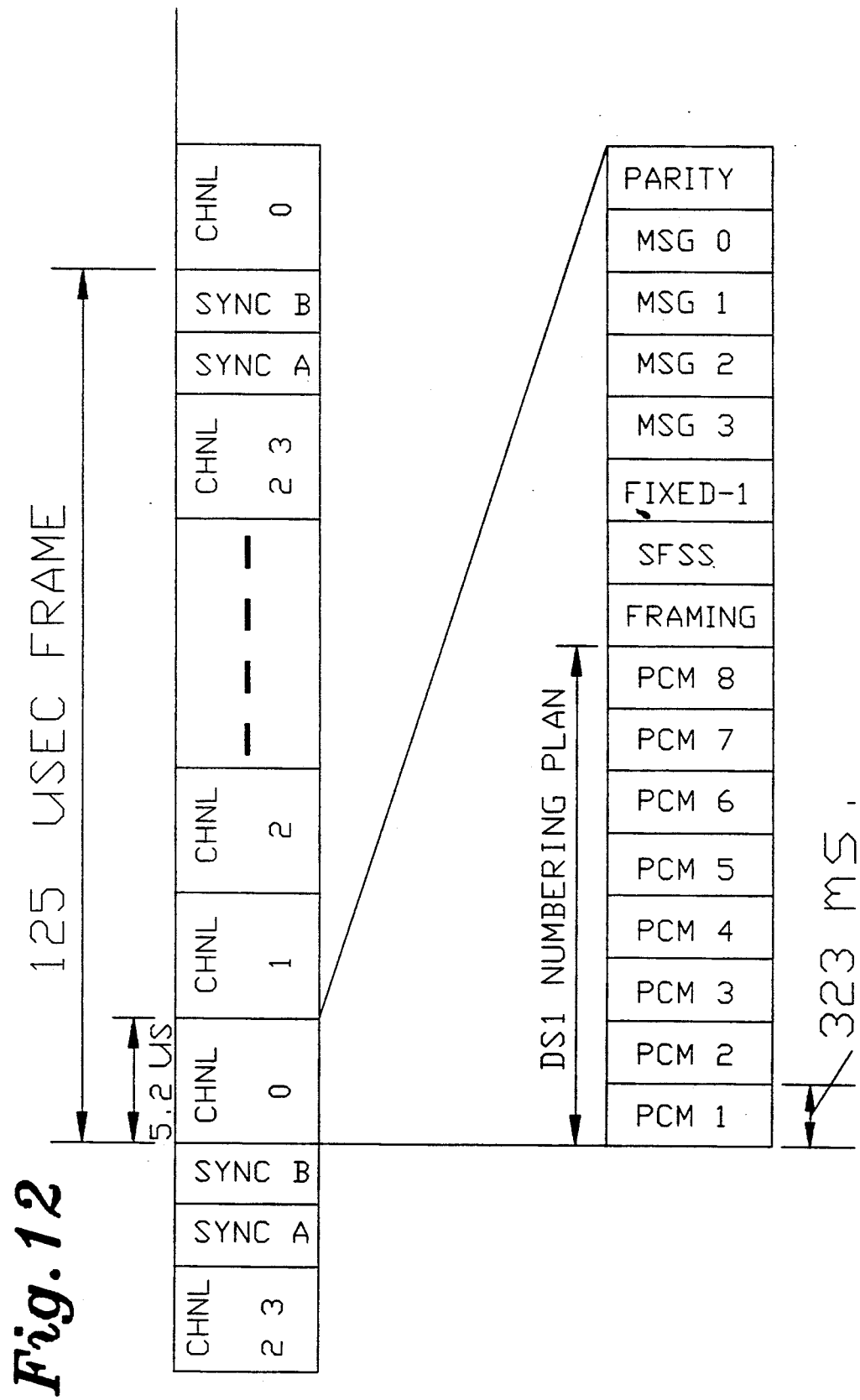
FIG. 12 illustrates the preferred network link format employed with the present invention.

While there are several formats for data flowing across the NLI inbound and outbound data interfaces 88 and 82, the format of data on each network link 47, whether created by the transmit link interface 84 or received at the receive link interface 86, will always be as indicated in FIG. 12.

The outbound data interface 82 will accept either parallel or serial input for network link transmission. The operation of the outbound data interface 82 is dependent on the strapping of the NLI mode select pins.

As stated previously, each of the thirty-two NLI circuits 50 on the NSC circuit 36 receives parallel data for each of twenty-four channels for network link transmission. This data is obtained from a 768 channel TDM bus. Referring to FIG. 12, each NLI 50 will latch a set of twenty-four, eleven bit samples at an approximate 192 kHz rate. The timing for this latching is derived from counters within the NLI 50 which are driven by the 12.352 MHZ control time base clock, FIG. 5, and 333 Hz synchronization pulse provided to each element on the NSC circuit 36. To identify which set of twenty-four channels of the 768 channel bus are intended for a given circuit, each NLI 50 has a position register loaded with a value from zero to thirty-one. Each NLI 50A on NSC circuit 36 will have a different value in its position register. The eleven bits handed to each NLI 50A originate at the TSI circuit 34 and consist of eight PCM and three system bits. The three system bits include a parity bit, a frame bit, and a superframe-synchronous signaling (SFSS) bit. All of these inputs except the SFSS bit are sourced from the switching complex. The SFSS bit is generated by the signaling circuit on the TSI circuit 34 and is passed to the NLI 50A in parallel with the other ten. The parity bit received by the NLI 50A is on the eight PCM and one frame bit generated by the TSI 34, and checking of this parity is performed in the outbound data interface 82, FIG. 11. If a parity error is detected, the appropriate bit of an NLI interrupt status register, FIG. 18, will be set and the DPC circuit's microprocessor will be interrupted. Regardless of the priority check results, the ten remaining data bits are transferred to the transmit link interface 84.

On DPC circuits 42, FIG. 4A, and PRI circuits 40, FIGS. 3 and 9, serial PCM and parallel signaling data is received at the outbound data interface 82 for transmission on a network link 47. The serial stream contains twenty-four channels of PCM data and a frame bit is received at a 1.544 MHz rate. A pin 92, FIG. 8, of the NLI 50 has been provided to source a transmit 1.544 MHz clock to be used on DPC circuits 42 and PRI circuits 40 in generating this data stream. An eight kHz transmit sync output pin 100, FIG. 8, has been provided on the NLI 50, so that channel order can be derived on the NLI 50. Timing of each of these clock signals is derived from the received network link synchronization information in conjunction with the 12.352 MHz input to the NLI 50 from the NLI PLL pin.

The eight bit PCM sample of each channel is extracted from the received serial stream and is converted into parallel form. The frame bit of the serial stream is latched and passed in parallel with the parallel PCM data of each channel to the transmit link interface 84. The four bits of signaling information received at the outbound data interface 82 represent the A,B,C, and D signaling bits for each channel. Based on system-defined superframe timing, the appropriate signaling bit of the four received is selected and sent to the transmit link interface 82 in parallel with the PCM and frame bits. Under microprocessor control, this signaling data may also be specified to replace the LSB of outgoing PCM samples. This type of control is maintained on a channel-by-channel basis through processor specifications for each channel in the transmit signaling control registers, FIG. 5.

Operation of the outbound data interface 82 is comparable on BRL circuits 38, FIG. 9, except that no signaling bits are passed to the NLI 50.

On DAS circuits 37, twenty-four eight bit parallel PCM samples are presented to the outbound data interface 82 every 125 microseconds for transmission to a network link. The NLI 50 will supply the DAS 37 with an eight kHz transmit sync output on pin 93 to be used with the on board 12.352 MHz clock such that the timing and channel order for passing data to the outbound data interface 82 can be derived. The DAS circuit 37, will supply the NLI 50 with data for transmission at a 192 kHz rate. This data will, in turn, be transferred to the transmit data interface 84.

On DSP circuits 42, serial PCM data is received at the outbound data interface 82 for transmission on a network link 47. The serial stream contains twenty-four channels of PCM data and is received at a 1.536 MHz rate. The 1.536 MHz transmit clock pin 95 of the NLI 50 has been provided to source the clock to be used on the DSP circuit 44 in generating this data stream. The eight kHz transmit sync pin 93 is also used for determining channel order. The 8 bit PCM sample of each channel is extracted from the serial stream, converted into parallel form and passed to the transmit link interface 84.

The transmit link interface 84 receives data from the outbound data interface 82 and the microprocessor interface 90. Sixteen bit data for link transmission is formed by combining the (up to) ten bits from the outbound data interface 82 with four bits from the microprocessor interface 90, generating odd parity on the set, and appending a bit fixed as logic one. Twenty-four such words are formed every 125 usec. Two link sync bits are added to these twenty-four, sixteen bit words and the entire block of information is serialized. The setting of the NLI's Master/Slave~pin 80 determines the coding employed on the outbound 3.088 MHz stream. NLI circuits 50 strapped to function as a master 50A employ a pulse-width modulation coding in order for the NLI circuits 50 operating as a slave 50B at the far end of the network link to be able to derive a clock from the low-to-high transition which begins each bit interval. NLI circuits 50 which are strapped as a slave 50B output the 3.088 MHz stream as simple NRZ, the ones represented as high voltages for the entire bit interval and zeros as low voltages.

The receive link interface 86 receives a 3.088 MHz network link and passes the stream immediately through a decoder. Transitions of data on the received stream are detected in the pulse-width modulation decoder, FIG. 5, and a 3.088 MHz clock is derived. This clock is divided by two to form a 1.544 MHz signal which, with respect to NLI circuits 50B specified for slave operation by their Master/Slave~pin 80 setting, will be sent out of the NLI 50B to a phase-locked loop circuit, FIG. 5, where 12.352 MHz is created and passed back to the NLI 50 for use in deriving all timing. The serial data output of the decoder is clocked into a shift register at a 3.088 MHz rate to convert the data into parallel form. Sixteen bit words are formed in this fashion consisting of ten bits bound for the inbound data interface 88, four bits for the microprocessor interface 90, a parity bit on the entire word, and a fixed bit of logic one. An odd parity checker is used to verify a properly received data word and, if a parity error is detected, the appropriate bit of the NLI interrupt status register, FIG. 5, will be set and the microprocessor of the NLI circuit 50B will be interrupted. In the 3.088 MHz link there are 386 bits transmitted every 125 microseconds. Since only 384 are used for channel data (twenty-four sets of sixteen bit words), two extra bits of link sync information are also received in the data stream. These bits are routed to the counter/timer circuit 92, FIG. 11, where they are used for acquiring synchronization to the link transmitter.

The inbound data interface 88 receives ten bits from the receive link interface 86 and transmits this data in either parallel or serial form. The mode select pins on the NLI 50 are used to select the output mode for each card.

On the NSC circuit 36, data from each of the thirty-two inbound data interfaces 88 are merged to form a 768 channel TDM bus. Each NLI master circuit 50A will source a set of twenty-four eleven bit samples at an approximate 192 kHz rate. The timing for this latching is derived from counters within the NLI circuit 50A which are driven by the 12.352 MHZ clock and 333 Hz synchronization pulse provided to each NLI 50A on the NSC circuit 36 by the clock card 32, FIG. 3. Each NLI circuit 50A has a position register loaded with a value from zero to thirty-one to determine when it should output to this 768 channel bus. When a given NLI circuit 50A is not outputting data, it will keep its output pins in a high impedance state. When a given NLI circuit 50 is outputting data, the EXG pin 97 of that NLI 50 will generate a low level pulse which is used for special purposes on the NSC circuit 36.

Eleven bits of output are provided by the inbound data interface 88 of each NLI circuit 50, consisting of eight PCM and three system bits. The three system bits include a parity bit, a frame bit and a SFSS bit. All of these outputs except the SFSS bit are sent to the TSI circuit 34, with the parity bit generated on the nine non-SFSS data bits. The SFSS bit is sent to the signaling circuit of the TSI circuit 34 in parallel with the other ten.

In DPC circuits 42 and PRI circuits 40, serial PCM data is output by the inbound data interface 88. The serial stream contains twenty-four channels of PCM data and a frame bit and is transmitted at a 1.544 MHz rate. The receive 1.544 MHz clock pin 92, FIG. 8, of the NLI has been provided to be used by DPC 42 and PRI 40 in latching this data stream. A 333 Hz receive sync output pin 94 has also been provided such that channel and frame order can be derived on these circuits. Timing of each of these clock signals is derived from the received network link sync information in conjunction with the 12.352 MHz input from the NLI phase locked loop circuit.

Signaling information obtained for each channel in the SFSS bit position on the received network link may be inserted into the LSB of each PCM word output by the inbound data interface 88 in accordance with the system-defined superframe timing. This is selectable on a channel-by-channel basis under microprocessor control by setting the bit corresponding to a channel in the received link signaling control registers, FIGS. 33–35. Operation of the inbound data interface 88 is comparable on BRL circuits 38, except that no signaling bit information is ever inserted into PCM samples.

In DAS circuits 37, twenty-four eight bit parallel PCM samples are output by the inbound data interface 88 every 125 usec. Each of the four NLI circuits 50B on the card will be assigned a distinct value in their position register, FIG. 19, to define when each should present parallel output onto a common output bus. When a given device is not passing data from its inbound data interface 88 to this bus, its output pins will remain in a high impedance state. The DAS circuit 37 circuitry will make use of the OSYC pin 98, FIG. 8, of the NLI circuit 50 to determine when output data should be latched from a given NLI circuit 50B.

In DSP circuits 42, serial PCM data is output by the inbound data interface 88. The serial stream contains twenty-four channels of PCM data and is transmitted at a 1.536 MHz rate. The 1.536 MHz receive clock pin 92 has been provided to source the clock to be used on the DSP circuit 44 in generating this data stream. An 8 kHz receive sync pin 100, FIG. 8, and the 1.536 MHz and 8 kHz pins provided for interaction with the inbound data interface 88 and those provided for interaction with the outbound data interface 82 are distinct. Each set has a different phase than the other. The eight bit PCM sample of each channel is extracted from the serial stream, converted into parallel form and passed to the transmit link interface 84.

For channels received by the DSP circuit 42, signaling bits are present in the LSB of PCM samples during the system-defined signaling frames. A-signaling bits will be captured by the NLI circuit 50 and stored in the receive signaling data registers, FIGS. 36–38, for reading by the card microprocessor.

The microprocessor interface 90 provides a variety of registers with which the microprocessor can communicate with the NLI circuit 50 and control its function. One major function controlled by the microprocessor interface 90 is associated with passing messages between circuits. This circuit will perform the necessary functions associated with embedding message information into the 3.088 MHz network link transmitted and, conversely, with extracting such information from the received link. The message and associated control information is allocated four out of every sixteen bits on a network link. These information bits are sent using a packet protocol at a 768 kbit/sec rate.

Figure 13:
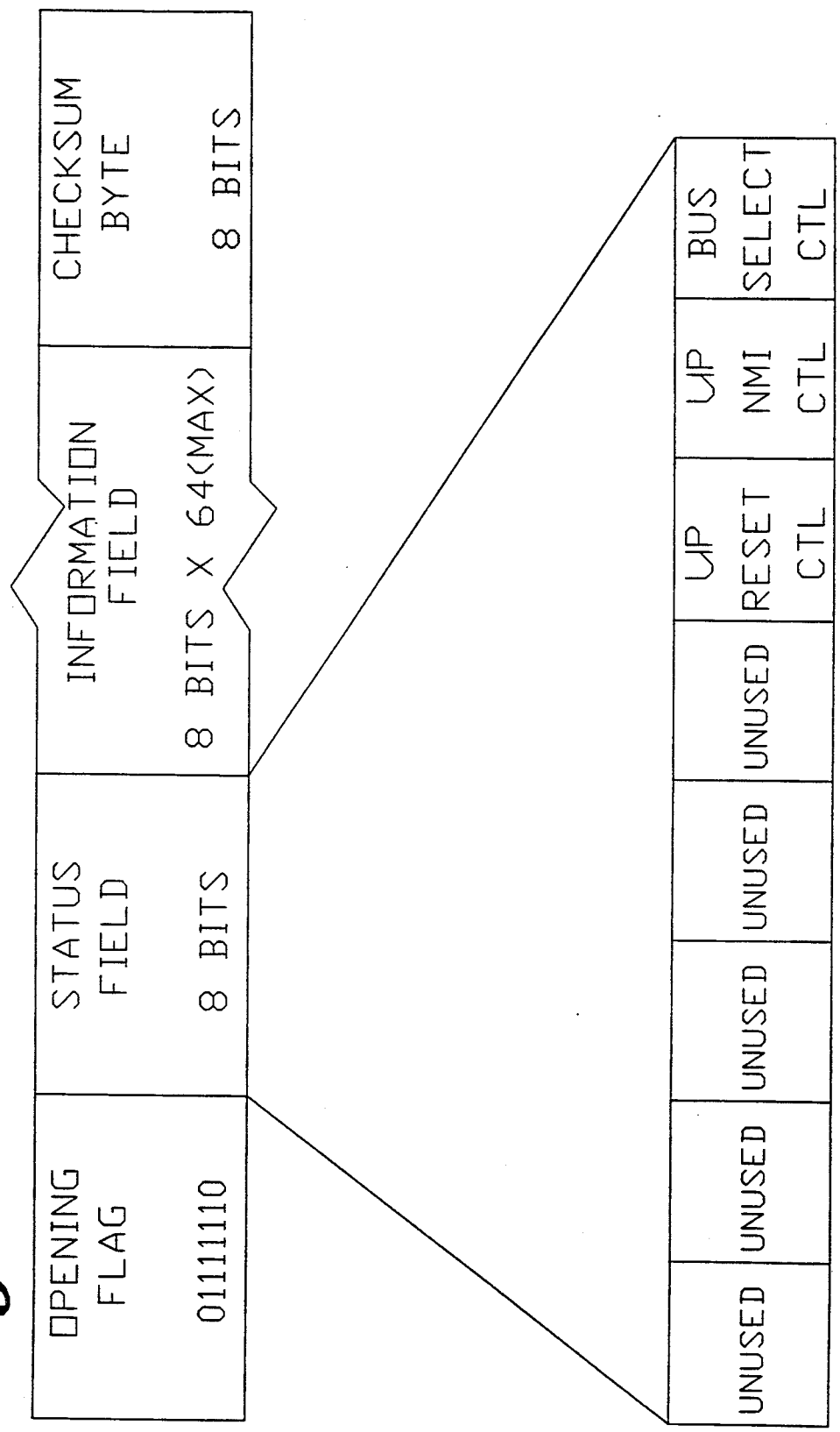
FIG. 13 shows the message format employed with the present invention.

Communications between the control and the network termination units is always initiated from the NSC circuit 36. When message information needs to be sent to a network card, microprocessor of the NSC 36 will buffer up to 64 bytes—the first being a byte count—in an NLI transmit FIFO, through means of writing to a transmit message data register, FIG. 28. Thereafter, the microprocessor will write a word to the NLI control register, FIG. 17, containing a logic one in the send message bit position. The NLI 50 will "packetize" the message bytes according to the protocol depicted in FIG. 13, adding flag, status field, and checksum bytes around this information field. Note that during times when no messages are being sent, the NLI circuit 50 will output non-flag characters in the 768 kbit/sec field.

The NLI circuit 50 constantly searches for incoming message information by checking for an opening flag in the message field of its received link. Once the opening flag is recognized and the byte count is determined, the NLI circuit 50 will buffer the message bytes in a receive FIFO. A running checksum on the message bytes will be kept as they are received, and this will be compared to the checksum byte appended to the incoming message. If the checksum received differs from that calculated, the appropriate bit of an interrupt status register, FIG. 18, will be set and the circuits microprocessor will be interrupted. Upon receipt of a valid message, the receive FIFO full bit of the interrupt status register, FIG. 18, will be set and the received status field bits will be interpreted and acted upon. In the NSC circuit 36, a received message will be detected by polling each interrupt status register, FIG. 18, of the NLI circuits 50 to see if this receive FIFO full bit is set. The message may then be read out of the NLI circuit 50 through the receive message data register, FIG. 29. The first byte read will be the byte count, and the microprocessor should loop that number of times, reading the (up to) sixty-three other message bytes.

The NLI circuit 50 will function in a similar fashion in all other modes with the following exceptions. First, on receipt of an inbound message, the circuit's microprocessor will be interrupted along with the indication of receive FIFO full in the NLI interrupt status register, FIG. 18. Secondly, on receipt of a message, the receive FIFO will become "locked" such that the message will not be overwritten by a second message to the card. Obviously, any subsequent messages which are passed while the FIFO remains locked will be lost. The processor must act to unlock the FIFO by altering the appropriate bit of the control register, FIG. 17, upon extracting the current message from the receive FIFO. The FIFO lock mechanism is not available for devices, such as those on the NSC card 36, with master designations on the Master/Slave~pin 80. Finally, no message should be transmitted by an NLI 50 specified to operate in Modes 1 through 3 until a message has been received requesting a response. However, there is nothing in the circuit to restrict sending an unsolicited message.

The NLI circuit 50 will "packetize" messages from the processor using a protocol consisting of adding an opening flag, a status field, and a checksum on all preceeding bytes except the opening flag. The opening flag represents the beginning of a message frame and will always have the value of 7E Hex (01111110 Binary). The status field is an eight bit field used for sending control information from the NSC circuit 36 to network cards—its contents have no meaning on links bound to an NSC 36. The status field bits are used to cause either a reset or a non-maskable interrupt (NMI) to the processor on an NSC circuit 36 or to cause it to switch which bus from which serial information is received. The (up to) sixty-four bytes of message information will be transmitted after the status field, with the first byte of the information field always being byte count of that field. While transmitting this data, a checksum value is calculated. This checksum byte will be inserted on the link after completion of the information field to provide the far end with a means of checking message integrity.

It should be noted that the byte count beginning the information field may take on the range from zero to sixty-three. A zero byte count message may be sent, for instance, to simply pass status field information between cards. However, a zero byte count message properly received at a slave device, even with the receive FIFO locked, will be interpreted and acted upon. A sixty-three byte count message is one with a completely full information field comprising one byte count digit and sixty-three actual data bytes.

The NLI circuit 50 is designed to recognize parity errors on data coming into the NLI circuit 50, as well as generate parity on data leaving the NLI circuit 50. Parity errors can be detected on outbound parallel data from the TSI Mode 0, on received 3.088 MHz serial data in all modes or on bytes transferred from either of the two FIFOs maintained within the NLI circuit 50. Odd parity is employed on the 3.088 MHz serial links, even parity is employed on the two internal FIFOs, and the type of parity is selected via the control register for Mode 0 TSI data checking and generation. Violations of parity are indicated as to type in the NLI interrupt status register, FIG. 18, and are always accompanied by an interrupt of the circuit's microprocessor. Should the microprocessor wish to mask any of these parity error interrupts, it may do so by setting the corresponding bit of the control register, FIG. 15. Further, should the microprocessor wish to cause any or all of these errors to test its own diagnostic software, bits of the control register, FIG. 14, have also been specified for this purpose.

Similar to the parity checking, the NLI circuit 50 will always observe the checksum byte associated with each received message. Should the checksum value calculated during message receipt not correspond exactly to that appended to the message, the circuit's microprocessor will receive an interrupt and an indication of such will be placed in the interrupt status register. Such interrupts may be masked or "caused" for diagnostic software checking by setting the appropriate bits of the control register.

Should the NLI 50 ever lose synchronization with the transmitter of its received network link, an indication of such will be made in the interrupt status register and the circuit's microprocessor will be interrupted. For NLI circuits strapped as a master 50A, the interrupt status register indication will be in the receive link out-of-sync bit location; for NLI circuits 50 strapped as slave units 50B, the interrupt will be indicated in the master clock out-of-sync bit. Further, in NLI circuits 50 operating as a master unit 50A, checks will be made that the internal counters are in step with the synchronization signal provided on a NLI sync input pin 97. Should such synchronization ever be lost, the master clock out-of-sync bit of the interrupt status register, FIG. 18, will be set and the circuit's processor interrupted. Consistent with the handling of other error interrupts, these types may be masked, or "caused", for diagnostic software checking by setting the appropriate bits of the control register.

The NLI circuit 50 also provides features for background testing of several system functions. There are registers in each NLI circuit 50 which allow the insertion of a known PCM and signaling pattern in place of the data of one channel to be output on the transmit network link. The microprocessor can specify an eight bit PCM and/or a four bit A,B,C, and D signaling value in the transmit insertion data registers, FIGS. 26 and 41, and a channel number designation in the transmit insertion address register, FIG. 25. By setting the enable PCM insertion bit of the control register, FIG. 16, the microprocessor will cause the A,B,C and D signaling value to be substituted during the system defined superframe timing on the SFSS bit for that channel. In this fashion, an NSC 36 can, for a channel out-of-service, send known values on the link to the switching complex and to a signaling circuit of the TSI 34 where action can be taken to check their operation. PCM insertion can take place without signaling insertion and vice versa. There are, similarly, extraction data register, FIGS. 39 and 40, and an address register, FIG. 24, in the NLI 50 for latching a given channel's PCM and signaling data as it is received from a network link 47. The insertion and extraction registers can be used either individually or as a pair to monitor a variety of system functions.

The NLI circuit 50 will have a 10 msec output pin for providing each card with a real-time signal for interrupting its processor. This 10 msec signal will be derived from the 12.352 MHz clock input to the NLI circuit 50. This interrupt should be acknowledged by reading the clear timer/NMI register of the NLI circuit 50, FIG. 43, after which the output signal will go inactive until the next interval has elapsed.

The NLI circuit 50 has an output pin for providing DSP circuits 42 with an interrupt signal for their microprocessor each time A-port signaling bits have been received for all channels on the network link. This 1.5 msec signal will be derived from the 12.352 MHz clock input to the NLI circuit 50 in accordance with the system-defined superframe structure. This interrupt should be acknowledged by reading the clear timer/NMI register of the NLI circuit 50, FIG. 43, after which the output signal will go inactive until the next interval has elapsed Four pins have been provided on the NLI circuit 50 to accommodate 56 or 64 kbps data links. Two pins represent clock signals generated by the NLI circuit 50 for use in transferring 56 or 64 kbps data into and out of the NLI circuit. The two clock signals are not in phase. The remaining two pins are the avenues for 56 or 64 kbps data I/O. On the PRI circuit 40, these pins will be used in transferring data between the NLI circuit 50 and a serial communications controller (SCC), which in turn will be connected to the circuit's microprocessor. In this fashion, the processor will be able to receive data from one channel within the NLI circuit 50 and, likewise, source the data bound to that channel. The 56 or 64 kbps channel with which the processor can interact will be one of those arriving/departing on the T1 line connected to the circuit. Data link operation must be enabled and 56 or 64 kbps operation specified by setting the appropriate bits in the control register, FIG. 16.

A DTACK output pin 102, FIG. 8, is provided on each NLI circuit 50 for use in handshaking during data transfers with a terminal circuit microprocessor.

The registers which compose the microprocessor interface to the NLI are described below and shown in FIGS. 14 et seq. Addresses for each of the registers are given along with their names. These addresses contain five bits and their designation is from A5-A1. On 68000-microprocessor based circuits which employ the NLI circuit 50, it should be expected that the NLI registers will not be at contiguous locations in the processor's address spectrum—the NLI registers may be placed in either the upper byte only or lower byte only of the processor's data bus. In addition to the address given with each register, there are Read-Only (RO) designations given to the appropriate registers. Any register without an RO designation is read/writeable.

In the control MS register, FIG. 14, of the NLI circuit 50, receive link out-of-sync interrupts cannot be generated for an NLI circuit with slave designation on its Master/Slave~pin 80; outbound data parity errors can only be caused on NLI circuits 50 strapped for Mode 0—the only operating mode where parity flows into the outbound data interface 82.

In the control SS register, FIG. 15, of the NLI circuit 50, even if a given interrupt is masked, the status register, FIG. 18, will continue to give indications that a given event has occurred. Setting bits of this register simply effects the operation of the interrupt output pin.

In the control TS register, FIG. 16, the IDE bit will be cleared whenever the device goes out of sync and the IDE bit must be set after the device acquires sync, regardless of the mode of operation. Bit three will always be read as zero, and it should not be expected to read back from this register exactly what was written to it in all cases. If in Mode 0, the SUFRM bit should be set to select 333 Hz sync operation.

In the control LS register, FIG. 17, the receive FIFO lock, will never be activated and can never be set for devices with a master designation on their Master/-Slave~pins 80. Bit five will always be read as a zero, and it should not be expected to read back from this register exactly what was written to it in all cases.

In the interrupt status register, FIG. 18, receive link out-of-sync interrupts will never occur for devices with slave designations on their Master/Slave~pins 80. Also, outbound data parity error interrupts will never occur for devices which have mode designations other than zero.

In the position register, FIG. 19, bits five through seven will always be read as zero, and it should be expected to read back from this register exactly what was written to it in all cases.

In the transmit link MS counter load register, FIG. 20, for NLI circuits 50A designated as a master, the value which should be placed into this register is B5H. For NLI circuits 50B designated a slave, the value which should be placed into this register is 08H.

In the transmit link LS counter load register, FIG. 21, for devices designated as a master circuit 50A, the value which should be placed into the register is F6H. For NLI circuits 50B designated slave, the value which should be placed into the register is DAH.

In the receive link MS counter load register, FIG. 22, for NLI circuits 50 designated as a master the value which should be placed into this register is 00H. While NLI circuits 50 devices designated slave, the value which should be placed into this register is BDH.

In the receive link LS counter load register, FIG. 23, for NLI circuits 50 designated as a master, the value which should be placed into this register is 02H. For devices designated slave, the value which should be placed into this register is C8H.

In the extraction address register, FIG. 24, bits five through seven will always be read as a zero, and it should not be expected to read back from this register exactly what was written to it in all cases.

In the insertion address register, FIG. 25, bits five through seven will always be read as a zero, and it should not be expected to read back from this register exactly what was written to it in all cases.

In the insertion MS data register, FIG. 26, bits four through seven will always be read as a zero, and it should not be expected to read back from this register exactly what was written to it in all cases.

In the 56/64 kbps data link address register, FIG. 27, bits five through seven will always be read as a zero, and it should not be expected to read back from this register exactly what was written to it in all cases.

The order of operations to be performed during device initialization should be as follows:

1. Mask all interrupts by writing FFh to the control SS register;
2. Write the appropriate data (given above) into the transmit and receive link counter load registers, FIGS. 20 and 23;
3. Read the interrupt status register and assure that the NLI 50 is giving "in-sync" indications. Continue to loop until the device does yield these indications;
4. Write the appropriate values (card specific) into the SUFRM bit of the control TS register, FIG. 16, and into the position register, FIG. 19;
5. Enable the IDE bit of the control TS register regardless of the type of PCM/system bit I/O employed;
6. Write card-specific data into the appropriate registers (which may be the control TS, control LS, transmit link signaling control, receive link signaling control, and/or 56/6 kbps data link address registers); and
7. Enable desired interrupts in the control SS register, FIG. 15.

While a particular embodiment of the invention has been disclosed in detail, it should be appreciated that many variations may be made without departing from the spirit and scope of the invention as defined in the appended claims.

We claim:

1. In a telecommunications network of transceiving informational sources, the improvement being a switching interface system for communication between said sources, comprising:
   a control unit connected with some of said sources including
   means for encoding information from some of said sources in a serial, pulse width binary format, and
   means for serially transmitting pulse width binary encoded pulses of said encoding information at a preselected transmission bit rate; and
   a network termination unit connected with other ones of said sources including
   means responsive to the serially transmitted, pulse width binary encoded pulses to extract therefrom a clock signal, and
   means responsive to said clock signal and said serially transmitted pulse width binary encoded pulses for synchronous decoding of the serially transmitted, pulse width binary encoded pulses for provision to said other ones of said sources connected with the network termination unit.

2. The switching interface system of claim 1 in which the network termination unit has
   an encoder for encoding data from the sources connected therewith into a pulse format and
   means responsive to the clock signal for transmitting the encoding data to the control unit in frequency synchronism with said transmission bit rate.

3. The switching interface system of claim 1 in which the extracted clock signal has a frequency which is substantially equal to the transmission bit rate frequency.

4. The switching interface system of claim 3 in which
   said control unit has a primary clock with a frequency which is a binary power multiple of the transmission bit rate, and
   said network termination unit has means for developing a clock signal which has a bit rate equal to the frequency of said primary clock.

5. The switching interface system of claim 1 in which said control unit has
   a decoder for decoding data from said network termination unit, and
   means for maintaining said decoder in frequency synchronism with the transmission bit rate of the transmitted pulse width binary encoded pulses.

6. The switching interface system of claim 5 in which said control unit includes means for maintaining said decoder in phase synchronism with the transmitted pulse width binary encoded pulses.

7. The switching interface system of claim 6 in which said phase synchronization means includes means to cause the time that a bit of data enters the encoding means to coincide with the instant that a bit emerges from the decoding means.

8. The switching interface system of claim 1 in which the control unit includes means for encoding said information in a binary pulse width modulated format with logic one states and logic zero states being represented by pulses of two different selected widths, respectively.

9. The switching interface system of claim 8 in which said pulses of two different selected widths have leading edge transitions occur at the same time during a bit interval.

10. The switching interface system of claim 9 in which said leading edge transitions are positive transitions.

11. The switching interface system of claim 8 in which said pulses of two different widths create pulse transitions in every data bit interval.

12. The switching interface system of claim 11 in which said pulse transitions are positive transitions.

13. The switching interface system of claim 1 in which said control unit includes means for periodically inserting phase synchronization pulses into said serially transmitted pulse width binary encoded pulses to provide phase synchronizational information to the network termination unit.

14. The switching interface system of claim 13 in which said control unit includes means responsive to an external clock for generating a phase reference signal, and means responsive to the phase reference signal generating means to insert said phase synchronization pulses into a stream of said serially transmitted pulse width binary encoded pulses.

15. The switching interface system of claim 13 in which said pulse width binary encoded pulses have a leading edge transition of a selected transitional sense, and said synchronizational pulses have a leading edge transition having the same transitional sense as said selected transitional sense of the binary encoded pulses.

16. The switching interface system of claim 15 in which said transitional sense is positive from a relatively low voltage to a relatively high voltage.

17. The switching interface system of claim 13 in which said network termination unit includes means responsive to said phase synchronization pulses to transmit data to said control unit in phase synchronism with said pulse width binary encoding data pulses at said preselected transmission bit rate.

18. In a telecommunications network of transceiving informational sources, the improvement being a switching interface system for communication between said sources, comprising:

a control unit connected with some of said sources including means for encoding information from some of said sources in a serial, pulse width binary format, and means for serially transmitting pulse width binary encoded pulses of said encoding information at a preselected transmission bit rate; and a network termination unit connected with other ones of said sources including means responsive to the serially transmitted, pulse width binary encoded pulses to extract therefrom a clock signal including means for generating said clock signal at a frequency which is a preselected multiple of the transmission bit rate, and means responsive to said clock signal and said serially transmitted pulse width binary encoded pulses for synchronous decoding of the serially transmitted, pulse width binary encoded pulses for provision to said other ones of said sources connected with the network termination unit.

19. The switching interface system of claim 18 in which said multiple is four.

20. The switching interface system of claim 13 in which each of the pulse width modulated pulses has a leading edge, and said clock signal extracting means includes a phase locked loop circuit with an input and an output, means for delaying the leading edge of the width modulated pulses to produce delayed pulse width modulated pulses, and means responsive to said delayed width modulated pulses for applying a corresponding delayed intermediate signal to the input of said phase locked loop, the output of said phase locked loop providing said clock signal at the preselected multiple of the transmission bit rate.

21. The switching interface system of claim 20 in which said delayed intermediate signal applying means includes a binary counter for producing an intermediate signal which has a frequency that is a preselected fraction of the transmission bit rate for interfacing with the input of the phase locked loop.

22. In a telecommunications network of transceiving informational sources, the improvement being a switching interface system for communication between said sources, comprising:

a control unit connected with some of said sources including means for encoding information from some of said sources in a serial, pulse width binary format, means for serially transmitting pulse width binary encoded pulses of said encoding information at a preselected transmission bit rate, and means for periodically inserting phase synchronization pulses into said serially transmitted pulse width binary encoded pulses to provide phase synchronizational information; and a network termination unit connected with other ones of said sources including means responsive to the serially transmitted, pulse width binary encoded pulses to extract therefrom a clock signal, and means responsive to said clock signal and said serially transmitted pulse width binary encoded pulses for synchronous decoding of the serially transmitted, pulse width binary encoded pulses for provision to said other ones of said sources connected with the network termination unit, means responsive to said phase synchronization pulses to transmit data to said control unit in phase synchronism with said pulse width binary encoding data pulses at said preselected transmission bit rate including a phase synchronization acquisition circuit for generating a synchronization control signal, and means responsive to the synchronization control signal for controlling the synchronous transmission of data to said control unit to maintain the transmission of data to the control unit in synchronization with the synchronization pulses generated thereby.

23. In a telecommunications network of transceiving informational sources, the improvement being a switching interface system for communication between said sources, comprising:

a control unit connected with some of said sources including means for encoding information from some of said sources in a serial, pulse width binary format, means for serially transmitting pulse width binary encoded pulses of said encoding information at a preselected transmission bit rate, and means for periodically inserting phase synchronization pulses into said serially transmitted pulse width binary encoded pulses to provide phase synchronizational information thereto; and a network termination unit connected with other ones of said sources including means responsive to the serially transmitted, pulse width binary encoded pulses to extract therefrom a clock signal, means responsive to said clock signal and said serially transmitted pulse width binary encoded pulses for synchronous decoding of the serially transmitted, pulse width binary encoded pulses for provision to said other ones of said sources connected with the network termination unit, means responsive to said phase synchronization pulses to transmit data to said control unit in phase synchronism with said pulse width binary encoding data pulses at said preselected transmission bit rate, including
- a counter triggered by said clock signal,
- means responsive to said counter for identifying the time division multiplexing channels of the telecommunication network, and
- means responsive to said synchronization control signal for maintaining said counter in phase synchronization with said phase synchronization pulses of said control unit.

24. The switching interface system of claim 23 in which
said control unit has one microprocessor,
said network termination unit has another microprocessor, and
one of said time division multiplexing channels is dedicated to passing messages from said one microprocessor of the control unit to said other microprocessor of the network termination unit.

25. In a telecommunications network of transceiving informational sources, the improvement being a switching interface system for communication between said sources, comprising:
a control unit connected with some of said sources including
- means for encoding information from said sources as a series of data pulses in a serial pulse width binary format,
- means for generating pulse width encoded synchronization pulses, and
- means for transmitting said series of data pulses and pulse width encoded synchronization pulses together on a time division multiplexing basis at a preselected bit rate; and a network termination unit connected with other ones of said sources including
- means responsive to at least said pulse width encoded synchronization pulses to derive a clock signal,
- means responsive to said clock signal and said serially transmitted pulse width binary encoded pulses for synchronous decoding of the series of pulse width encoded data pulses for connection to said other ones of the sources connected with the network termination unit, and
- means responsive to said pulse width encoded synchronization pulses to control synchronization of the synchronous decoding means of the network termination unit with the encoding means of the control unit.

26. The switching interface system of claim 25 in which
said data pulses have preselected pulse widths which differ from one another, and
the synchronization pulses have a pulse width differing from the preselected pulse widths of the data pulses.

27. The switching interface system of claim 25 in which said network termination unit includes means for coding information from the other ones of said sources as a series of uniform binary data pulses,
means for generating uniform synchronization pulses having a pulse width which is substantially the same as that of the uniform binary data pulses in synchronism with said pulse width encoded pulses, and
means for transmitting said uniform synchronization pulses together with said uniform binary data pulses as a series of uniform pulses.

28. The switching interface system of claim 27 in which said control unit includes means responsive to said uniform synchronization pulses to decode said binary data pulses from the termination unit.

29. The switching interface system of claim 28 in which said control unit includes means responsive to said uniform synchronization pulses to determine whether they are in phase synchronization with transmission of the pulse width encoding synchronization pulses of the control unit.

30. The switching interface system of claim 27 in which at least some preselected ones of said uniform synchronization pulses received by the control unit have a binary logic state opposite to that of the pulse width encoding synchronization pulses transmitted by the control unit.

31. The switching interface system of claim 25 in which
said series of data pulses are pulse width binarily encoded by said encoding means, with logic-one data pulses having a different pulse width than logic-zero data pulses, and in which
said means for generating synchronization pulses generates said synchronization pulses with a pulse width that differs from both the logic-zero data pulses and the logic-one data pulses.

32. The switching interface system of claim 25 in which
said preselected bit rate at which the data pulses in the synchronization pulses are transmitted is a substantially uniform rate, and
said clock signals in the network termination unit are produced at a preselected uniform frequency which is a preselected multiple of the uniform bit rate.

33. The switching interface system of claim 25 in which said network termination unit has means for transmitting data from the other ones of the sources connected thereto to the control unit which includes means responsive to said synchronization pulses for maintaining said data transmitted to the control unit in phase synchronization with the pulse width encoded synchronization pulses from the control unit.

34. In a telecommunications network of transceiving informational sources, the improvement being a switching interface system for communication between said sources, comprising:
a control unit connected with some of said sources including
means for encoding information from said sources as a series of data pulses,
means for generating pulse width encoded synchronization pulses, and
means for transmitting said series of data pulses and pulse width encoded synchronization pulses together on a time division multiplexing basis at a preselected bit rate; and a network termination unit connected with other ones of said sources including
means responsive to at least said pulse width encoded synchronization pulses to derive a clock signal,
means responsive to said clock signal and said serially transmitted information encoded for synchronous decoding of the series of data pulses for connection to said other ones of the sources connected with the network termination unit,
means for transmitting data from the other ones of the sources connected thereto to the control unit which includes means responsive to said synchronization pulses for maintaining said data transmitted to the control unit in phase synchronization with the pulse width encoded synchronization pulses from the control unit including
a phase synchronization acquisition circuit responsive to the synchronization pulses received at the network termination unit to develop a synchronization control signal for controlling the phase synchronization of the encoding means, and
means responsive to said pulse width encoded synchronization pulses to control synchronization of the synchronous decoding means of the network termination unit with the encoding means of the control unit.

35. The switching interface system of claim 34 in which the phase synchronization acquisition circuit includes
means associated with said encoding means for generating synchronization pulse receipt signals in response to receipt of said synchronization pulses from the control unit,
a counter of said encoding means responsive to said synchronization control signal to count clock pulses in phase synchronism with the synchronization pulses,
means responsive to said counter for generating said synchronization control signal to indicate when the next synchronization pulse should be received when the counter is in phase synchronism with the synchronization pulses, and
means responsive to said synchronization pulse receipt signal and said synchronization control signal not being generated within a preselected time period of one another for generating an out-of-sync signal.

36. The switching interface system of claim 35 including means responsive to said out-of-sync signal for resynchronization of said counter.

37. The switching interface system of claim 34 in which said network termination unit includes means responsive to said out-of-sync signal for producing an out-of-sync indication.

38. In a telecommunications network of informational sources, the improvement being a switching interface system for communication between said sources, comprising:
a control unit connected with some of said sources including
means for binarily encoding information from a series of data pulses,
means for decoding information received in a series of data pulses,
means for generating a series of synchronization pulses of a preselected width differing from those of the data pulses, and
means for transmitting said encoded information and said synchronization pulses together at a preselected bit rate; and
a network termination unit connected with other ones of said sources including
means responsive to at least said synchronization pulses to derive a clock signal,
means responsive to said clock signal and said serially transmitted binary encoded pulses for synchronous encoding and transmission of information from said other one of the sources to the control unit, and
means responsive to said synchronization pulses to control phase synchronization of the encoding and transmitting means of said network termination unit with said decoding means of the control unit.

39. The switching interface system of claim 38 in which said clock signal deriving means includes means responsive in part to the preselected bit rate of the series of data pulses to derive said clock signal.

40. In a telecommunications network or informational sources, the improvement being a switching interface system for communication between said sources, comprising:
a control unit connected with some of said sources including
means for encoding information from a series of data pulses,
means for decoding information received in a series of data pulses,
means for generating synchronization pulses of a preselected width differing from those of the data pulses, and
means for transmitting said encoded information and said synchronization pulses together at a preselected bit rate; and
a network termination unit connected with other ones of said sources including
means responsive to at least said synchronization pulses to derive a clock signal,
means responsive to said clock signal and said serially transmitted information encoded data pulses for synchronous encoding and transmission of information from said other one of the sources to the control unit,
means responsive to said synchronization pulses to control phase synchronization of the encoding and transmitting means of said network termination unit with said decoding means of the control unit,
means responsive to the synchronization pulses from the control unit for detecting phase nonsynchronization with said control unit, and
means responsive to said nonsynchronization detecting means to alter the timing of the encoding and transmitting means to eliminate the condition of nonsynchronization.

41. In a telecommunications network of informational sources, the improvement being a switching interface system for communication between said sources, comprising:
a control unit connected with some of said sources including means for encoding information from a series of data pulses, means for decoding information received in a series of data pulses, means for generating synchronization pulses of a preselected width differing from those of the data pulses, and means for transmitting said encoded information and said synchronization pulses together at a preselected bit rate; and a network termination unit connected with other ones of said sources including means responsive to at least said synchronization pulses to derive a clock signal, means responsive to said clock signal and said serially transmitted information encoded data pulses for synchronous encoding and transmission of information from said other one of the sources to the control unit, means responsive to said synchronization pulses to control phase synchronization of the encoding and transmitting means of said network termination unit with said decoding means of the control unit, and means responsive to the synchronization pulse from the control unit for transmitting to the control unit an indication of phase nonsynchronization.

42. A method of communication in a synchronous digital data communication network, comprising the steps of:

receiving at a controller circuit a stream of binary data pulses in a nonself-clocking format in which clock signals are not carried with the stream of binary data pulses;

converting the nonself-clocking data stream to a corresponding self-clocking pulse width modulated binary data stream;

transmitting the pulse width binary modulated data stream to a termination unit of the network;

extracting a clock signal from the transmitted, binary pulse width modulated data stream received at the termination unit; and employing the extracted clock signal to decode the transmitted, pulse width modulated data stream to a stream of binary data pulses in nonself-clocking format.

43. The method of claim 42 including the step of employing the extracted clock signal to transmit a stream of data from the termination unit to the controller circuit in synchronism with the transmissions of the pulse width modulated data stream transmitted to the termination unit.

44. The method of claim 42 including the steps of inserting a pulse width modulated synchronization pulse into the self-clocking pulse width modulated binary data stream, and employing the pulse width modulated synchronization pulse to maintain phase synchronization of communications between the controller circuit and the termination circuit.

45. The method of claim 42 in which the step of transmitting includes the step of transmitting each pulse width modulated pulse at the beginning of each clock cycle.

46. A method of communication in a synchronous digital data communication network, comprising the steps of:

receiving at a controller circuit a stream of binary data pulses in a nonself-clocking format in which clock signals are not carried with the stream of binary data pulses;

converting the nonself-clocking data stream to a corresponding self-clocking pulse width modulated binary data stream;

transmitting the pulse width modulated data stream to a termination unit of the network with preselected transitions at a preselected time during each clock cycle;

extracting a clock signal from the transmitted, pulse width modulated data stream received at the termination unit; and employing the extracted clock signal to decode the transmitted, pulse width modulated data stream to a stream of binary data pulses in a nonself-clocking format.

* * * * *